(12) United States Patent
Suk et al.

(10) Patent No.: US 9,613,871 B2
(45) Date of Patent: Apr. 4, 2017

(54) SEMICONDUCTOR DEVICE AND FABRICATING METHOD THEREOF

(71) Applicants: Sung-Dae Suk, Seoul (KR); Kang-Ill Seo, Chungcheongbuk-do (KR)

(72) Inventors: Sung-Dae Suk, Seoul (KR); Kang-Ill Seo, Chungcheongbuk-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/801,332

(22) Filed: Jul. 16, 2015

(65) Prior Publication Data

US 2017/0018462 A1    Jan. 19, 2017

(51) Int. Cl.

| H01L 27/088 | (2006.01) |
|---|---|
| H01L 21/8238 | (2006.01) |
| H01L 29/06 | (2006.01) |
| H01L 29/423 | (2006.01) |
| H01L 29/786 | (2006.01) |
| H01L 27/092 | (2006.01) |
| H01L 29/66 | (2006.01) |
| H01L 21/84 | (2006.01) |

(52) U.S. Cl.
CPC ........... *H01L 21/823807* (2013.01); *H01L 21/823814* (2013.01); *H01L 21/823864* (2013.01); *H01L 21/84* (2013.01); *H01L 27/092* (2013.01); *H01L 29/0649* (2013.01); *H01L 29/0673* (2013.01); *H01L 29/42392* (2013.01); *H01L 29/66545* (2013.01); *H01L 29/66742* (2013.01); *H01L 29/78618* (2013.01); *H01L 29/78681* (2013.01); *H01L 29/78684* (2013.01); *H01L 29/78696* (2013.01)

(58) Field of Classification Search
CPC ............. H01L 27/0886; H01L 29/785; H01L 29/42356
USPC .................... 257/351, 401 TT, 401
See application file for complete search history.

(56) References Cited

U.S. PATENT DOCUMENTS

| 8,384,065 B2 | 2/2013 | Bangsaruntip et al. |
|---|---|---|
| 2005/0130358 A1 | 6/2005 | Chidambarrao et al. |
| 2007/0181959 A1 | 8/2007 | Park et al. |
| 2007/0181977 A1 | 8/2007 | Lochtefeld et al. |

(Continued)

FOREIGN PATENT DOCUMENTS

KR    1020070068725    7/2007

*Primary Examiner* — Tan N Tran
(74) *Attorney, Agent, or Firm* — F. Chau & Associates, LLC

(57) ABSTRACT

A semiconductor device is provided. A substrate includes a first region and a second region. A first wire pattern, extending in a first direction, is formed at a first height from the substrate of the first region. A second wire pattern, extending in a second direction, is formed at a second height from the substrate of the second region. The first height is different from the second height. A first gate electrode, surrounding the first wire pattern, extends in a third direction crossing the first direction. A second gate electrode, surrounding the second wire pattern, extends in a fourth direction crossing the second direction. A first gate insulation layer is formed along a circumference of the first wire pattern and a sidewall of the first gate electrode. A second gate insulation layer is formed along a circumference of the second wire pattern and a sidewall of the second gate electrode.

23 Claims, 21 Drawing Sheets

(56) References Cited

U.S. PATENT DOCUMENTS

| | | |
|---|---|---|
| 2009/0095981 A1 | 4/2009 | Kang et al. |
| 2009/0289304 A1 | 11/2009 | Pouydebasque et al. |
| 2010/0187503 A1 | 7/2010 | Moriyama et al. |
| 2011/0147805 A1 | 6/2011 | Irisawa et al. |
| 2012/0007052 A1 | 1/2012 | Hobbs et al. |
| 2013/0026449 A1 | 1/2013 | Bangsaruntip et al. |
| 2015/0340490 A1* | 11/2015 | An ........................ H01L 29/785 257/401 |
| 2016/0204195 A1* | 7/2016 | Wen .................. H01L 21/02532 257/347 |

* cited by examiner

SEMICONDUCTOR DEVICE AND FABRICATING METHOD THEREOF

TECHNICAL FIELD

The present inventive concept relates to a semiconductor device and a fabricating method thereof.

DISCUSSION OF RELATED ART

As the density of a semiconductor device integrated on a substrate increases, a gate-all-around structure has been proposed. In the gate-all-around structure, a channel region of a transistor is formed of a silicon body shaped of a nanowire, and a gate is formed to surround the silicon body.

When the gate-all-around structure is formed in a three-dimensional channel, a current-driving capability thereof may increase while suppressing a short channel effect (SCE).

SUMMARY

According to an exemplary embodiment of the present inventive concept, a semiconductor device is provided. A substrate includes a first region and a second region. A first wire pattern, extending in a first direction, is formed at a first height from the substrate of the first region. A second wire pattern, extending in a second direction, is formed at a second height from the substrate of the second region. The first height is different from the second height. A first gate electrode, surrounding the first wire pattern, extends in a third direction crossing the first direction. A second gate electrode, surrounding the second wire pattern, extends in a fourth direction crossing the second direction. A first gate insulation layer is formed along a circumference of the first wire pattern and a sidewall of the first gate electrode. A second gate insulation layer is formed along a circumference of the second wire pattern and a sidewall of the second gate electrode.

According to an exemplary embodiment of the present inventive concept, a semiconductor device is provided. A substrate includes a first region and a second region. A first wire pattern and a third wire pattern are formed on the substrate of the first region. A second wire pattern and a fourth wire pattern are formed on the substrate of the second region. A first gate electrode includes a first portion and a second portion. The first portion surrounds the first wire pattern and the third wire pattern. A second gate electrode includes a third portion and a fourth portion. The third portion surrounds the second wire pattern and the fourth wire pattern. A first gate spacer is formed on the second portion of the first gate electrode. A second gate spacer is formed on the fourth portion of the second gate electrode. A first source/drain is in contact with the first wire pattern and the third wire pattern. A second source/drain is in contact with the second wire pattern and the fourth wire pattern. A first gate insulation layer is formed along a circumference of the first wire pattern, a circumference of the third wire pattern and a sidewall of the second portion of the first gate electrode. The first gate insulation layer is in contact with the first source/drain and a sidewall of the first gate spacer. A second gate insulation layer is formed along a circumference of the second wire pattern, a circumference of the fourth wire pattern and a sidewall of the fourth portion of the second gate electrode. The second gate insulation layer is in contact with the second source/drain and a sidewall of the second gate spacer. The first to fourth wire patterns are disposed at different heights from a top surface of the substrate.

According to an exemplary embodiment of the present inventive concept, a fabrication method of a semiconductor device is provided. A first fin type structure is formed on a first region of a substrate. The first fin type structure includes first semiconductor patterns and second semiconductor patterns alternately stacked on each other. The first and second semiconductor patterns extend in a first direction. A second fin type structure is formed on a second region of the substrate. The first fin type structure includes third semiconductor patterns and fourth semiconductor patterns alternately stacked on each other. The third and fourth semiconductor patterns extend in a second direction. The third semiconductor patterns include the same material with the first semiconductor patterns. The fourth semiconductor patterns include the same material with the second semiconductor patterns. A first dummy gate electrode and a second dummy gate electrode are formed on the first fin type structure and the second fin type structure, respectively. The first dummy gate electrode extends in a third direction crossing the first direction, and the second dummy gate electrode extends in a fourth direction crossing the second direction. A first gate spacer and a second gate spacer are formed on a sidewall of the first dummy gate electrode and a sidewall of the second dummy gate electrode, respectively. A first mask pattern is formed on the second region. The first mask pattern covers the second dummy gate electrode and the second gate spacer, exposing the first dummy gate electrode and the first gate spacer. The first dummy gate electrode and the first semiconductor patterns are removed using the first mask pattern to form a first wire pattern group which is made of the second semiconductor patterns. A second mask pattern is formed on the first region, covering the first wire pattern group and the first gate spacers. The second dummy gate electrode and the fourth semiconductor patterns are removed using the second mask pattern to form a second wire pattern group which is made of the third semiconductor patterns.

According to an exemplary embodiment of the present inventive concept, a fabrication method of a semiconductor device is provided. First semiconductor layers and second semiconductor layers are alternately stacked on each other on a substrate. The first semiconductor layers and the second semiconductor layers which are formed on the substrate of a first region are patterned to form first semiconductor patterns and second semiconductor patterns. The first semiconductor patterns are made of the first semiconductor layers. The second semiconductor patterns are made of the second semiconductor layers. The first semiconductor layers and the second semiconductor layers which are formed on the substrate of a second region are patterned to form third semiconductor patterns and fourth semiconductor patterns. The third semiconductor layers are made of the first semiconductor layers. The fourth semiconductor layers are made of the second semiconductor layers. A pair of first source/drains is on the substrate of the first region. The first semiconductor patterns and the second semiconductor patterns are interposed between the pair of the first source/drains. A pair of second source/drains is formed on the substrate of the second region. The third semiconductor patterns and the fourth semiconductor patterns are interposed between the pair of the second source/drains. The first semiconductor patterns are removed to form first wire patterns which are made of the second semiconductor patterns. The fourth semiconductor patterns are removed to form second wire patterns which are made of the third semiconductor patterns. A first gate electrode is formed to circumferentially surround the first wire patterns. A second gate electrode is formed to circumferentially surround the second wire patterns. Each of the first wire patterns is different in height from each of the second wire patterns.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
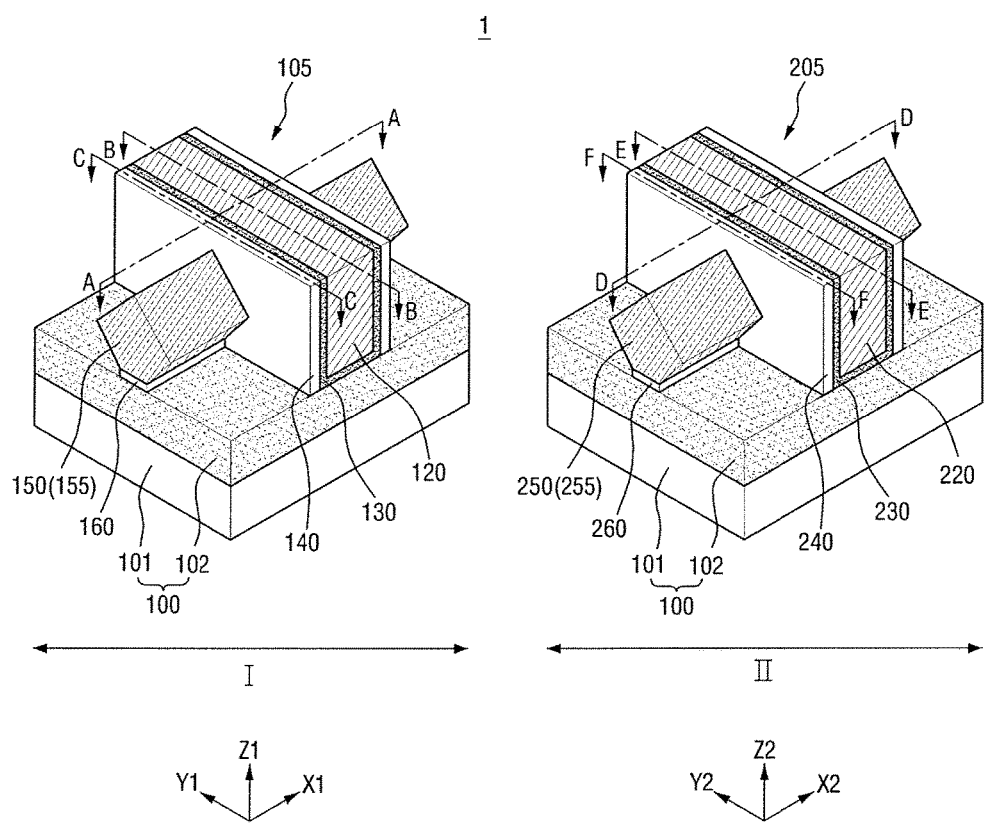
FIG. 1 is a perspective view illustrating a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, a semiconductor device according to an exemplary embodiment of the present inventive concept will be described with reference to FIGS. 1 to 4B.

Figure 2:
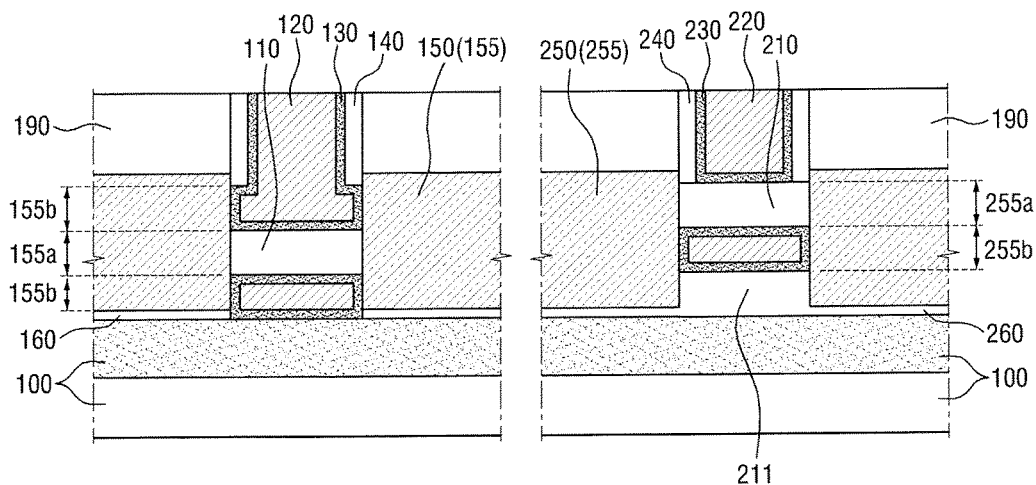
FIG. 2 is a cross-sectional view taken along lines A-A and D-D of FIG. 1.
Figure 3:
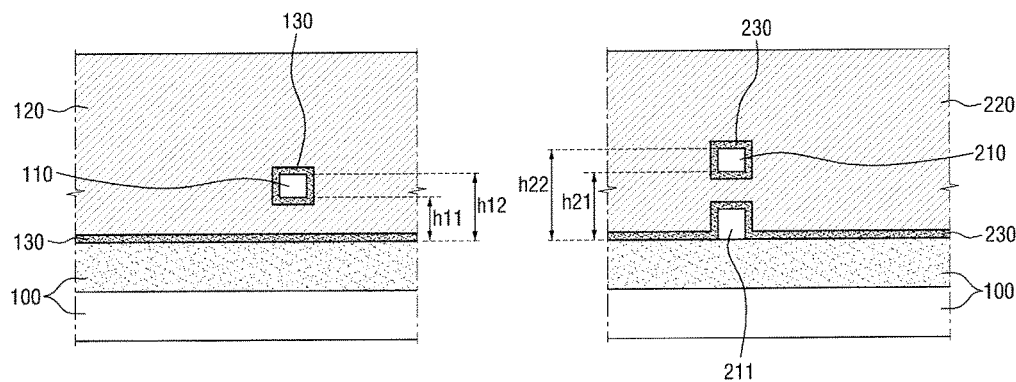
FIG. 3 is a cross-sectional view taken along lines B-B and E-E of FIG. 1.
Figure 4A:
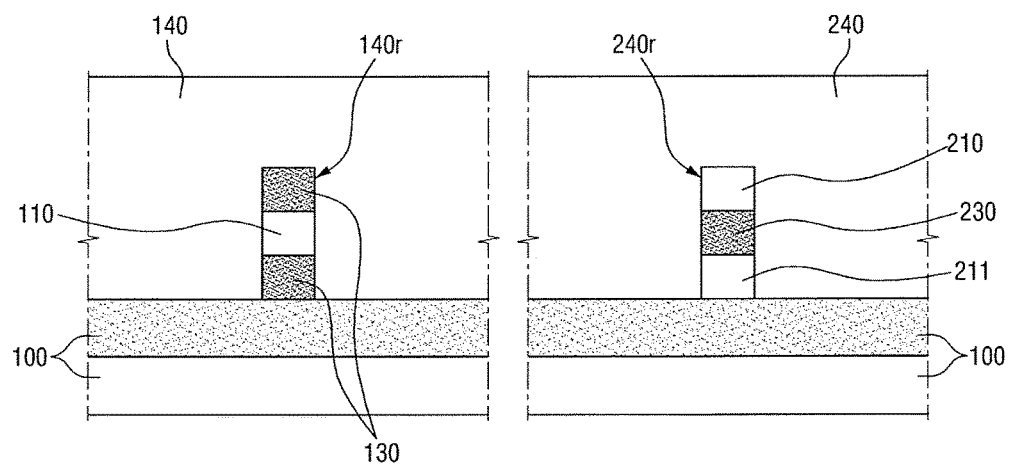
FIGS. 4A and 4B are cross-sectional views taken along lines C-C and F-F of FIG. 1.
Figure 4B:
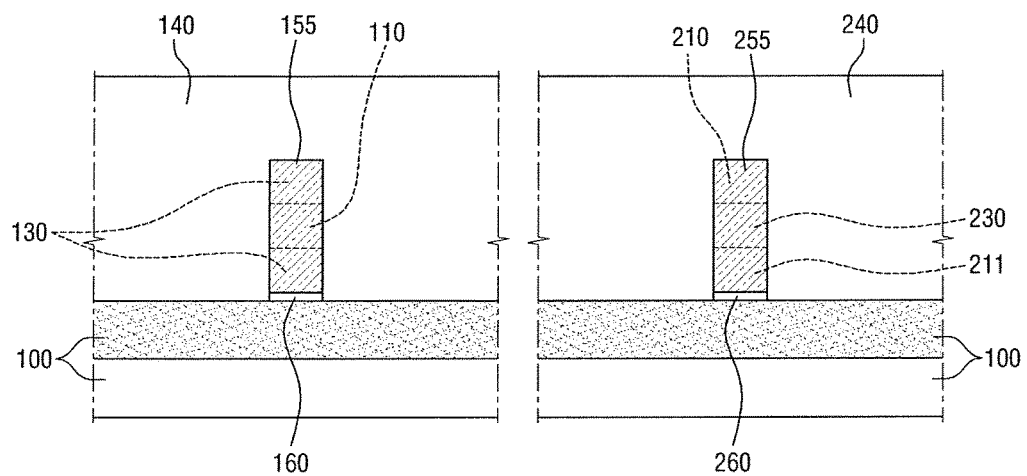

FIG. 1 is a perspective view illustrating a semiconductor device according to an exemplary embodiment of the present inventive concept. FIG. 2 is a cross-sectional view taken along lines A-A and D-D of FIG. 1. FIG. 3 is a cross-sectional view taken along lines B-B and E-E of FIG. 1. FIG. 4A is a cross-sectional view taken along lines C-C and F-F of FIG. 1. FIG. 4B is an alternative exemplary embodiment of FIG. 4A.

For brevity, an interlayer insulation layer is not illustrated in FIG. 1. In addition, FIGS. 4A and 4B are cross-sectional views taken along the sidewalls of gate spacers 140 and 240 adjacent to epitaxial layers 155 and 255.

Referring to FIGS. 1 to 4B, the semiconductor device 1 includes substrate 100, a first wire pattern 110, a second wire pattern 210, a first gate electrode 120, a second gate electrode 220, a first gate insulation layer 130, a second gate insulation layer 230, first gate spacers 140, second gate spacers 240, a first source/drain 150, and a second source/drain 250.

The substrate 100 includes a first region I and a second region II. The first and second regions I and II may be separated from each other or may be connected to each other. For example, the first region I may be a P type transistor region and the second region II may be an N type transistor region. A first transistor 105 may be a P type transistor and a second transistor 205 may be an N type transistor. Therefore, the first transistor 105 is formed in the first region I and the second transistor 205 is formed in the second region II.

The substrate 100 may be, for example, bulk silicon or silicon-on-insulator (SOI). Alternatively, the substrate 100 may be a silicon substrate or a substrate made of other materials selected from the group consisting of, for example, silicon germanium, indium antimonide, lead telluride compound, indium arsenide, indium phosphide, gallium arsenide, and gallium antimonide, but aspects of the present inventive concept are not limited thereto. In addition, the substrate 100 may be a substrate having an epitaxial layer formed on a base substrate.

In semiconductor devices according to embodiments of the present inventive concept, it is assumed that the substrate 100 includes a lower substrate 101 and an upper substrate 102 formed on one surface of the lower substrate 101. For example, the lower substrate 101 may be a semiconductor substrate and the upper substrate 102 may be an insulating substrate. The substrate 100 may include a semiconductor substrate and an insulating substrate formed on one surface of the semiconductor substrate, for example, a silicon-on-insulator (SOI).

The first transistor 105 includes the first wire pattern 110, the first gate electrode 120, the first gate insulation layer 130, the first gate spacers 140, and the first source/drain 150.

The second transistor 205 includes the second wire pattern 210, the second gate electrode 220, the second gate insulation layer 230, the second gate spacers 240 and the second source/drain 250.

The first wire pattern 110 is formed on the substrate 100. The first wire pattern 110 extends in a first direction X1. The first wire pattern 110 is formed on the upper substrate 102 while being spaced apart from the upper substrate 102. For example, the first wire pattern 110 is not in contact with the substrate 100

For the first transistor 105 of a P type transistor, the first wire pattern 110 included in the first transistor 105 may include, for example, a material having high hole mobility. The first wire pattern 110 may include, for example, one of SiGe and Ge, but not limited thereto.

The second wire pattern 210 is formed on the substrate 100. The second wire pattern 210 extends in a third direction X2. The second wire pattern 210 is formed on the upper substrate 102 while being spaced apart from the upper substrate 102.

The second transistor 205 further includes a dummy wire pattern 211 formed between the substrate 100 and the second wire pattern 210. The dummy wire pattern 211 extends in the third direction X2. The dummy wire pattern 211 is spaced apart from the second wire pattern 210. The dummy wire pattern 211 is in contact with the substrate 100. For example, the dummy wire pattern 211 is in direct contact with the upper substrate 102 of the substrate 100.

The second wire pattern 210 may include a different material from the first wire pattern 110. The second wire pattern 210 may include, for example, a material having etching selectivity with respect to the first wire pattern 110. In other words, when the first wire pattern 110 is etched, the second wire pattern 210 is barely etched. When the second wire pattern 210 is etched, the first wire pattern 110 is barely etched. The reason why the second wire pattern 210 includes a material having etching selectivity with respect to the first wire pattern 110 will later be described in detail with regard to the fabricating method of the semiconductor device.

For the second transistor 205 of an N type transistor, the second wire pattern 210 included in the second transistor 205 may include, for example, a material having high electron mobility. The second wire pattern 210 may include, for example, one of Si and a III-V group compound semiconductor material, but the present inventive concept is not limited thereto.

The III-V group compound semiconductor material may include, for example, a binary compound, a ternary compound or a quaternary compound prepared by combining at least one group III element of aluminum (Al), gallium (Ga) and indium (In) with at least one group V element of phosphorus (P), arsenic (As) and antimony (Sb).

The dummy wire pattern 211 and the second wire pattern 210 may include the same material. The dummy wire pattern 211 may include, for example, one of Si and a III-V group compound semiconductor.

Cross-sections of the first wire pattern 110 and the second wire pattern 210 illustrated in FIG. 3 are rectangular, but aspects of the present inventive concept are not limited thereto. Edges of the first wire pattern 110 and the second wire pattern 210 may be rounded by a trimming process.

In the semiconductor device 1 according to the first embodiment of the present inventive concept, the second wire pattern 210 and the first wire pattern 110 are formed at different heights from each other.

A height ranging from the top surface of the substrate 100 to a bottommost part of the first wire pattern 110 may be referred to as a first_first height h11 and a height ranging from the top surface of the substrate 100 to a topmost part of the first wire pattern 110 may be referred to as a first_second height h12. In addition, a height ranging from the top surface of the substrate 100 to a bottommost part of the second wire pattern 210 may be referred to as a second_first height h21 and a height ranging from the top surface of the substrate 100 to a second wire pattern 210 may be referred to as a second_second height h22.

For the sake of convenient explanation, in view of the top surface of the substrate 100, the first height at which the first wire pattern 110 is formed is defined as a median value of the first_first height h11 and the first_second height h12, and the second height at which the second wire pattern 210 is formed is defined as a median value of the second_first height h21 and the second_second height h22. For example, the height ranging from the top surface of the substrate 100 to the first wire pattern 110 may be a median value of the first_first height h11 and the first_second height h12.

The height h11 ranging from the top surface of the substrate 100 to a bottommost part of the first wire pattern 110 may be substantially equal to or greater than a thickness of the dummy wire pattern 211. In addition, the height h12 ranging from the top surface of the substrate 100 to a topmost part of the first wire pattern 110 may be substantially equal to or smaller than the height h21 ranging from the top surface of the substrate 100 to a bottommost part of the second wire pattern 210.

For example, in the second region II, the second wire pattern 210 and the dummy wire pattern 211 are not positioned between first_first height h11 and the first_second height h12. In addition, in the first region I, the first wire pattern 110 is not positioned between the second_first height h21 and the second_second height h22.

Therefore, in view of the top surface of the substrate 100, the second height at which the second wire pattern 210 is formed is greater than the first height at which the first wire pattern 110 is formed.

In the first region I, the first gate electrode 120 is positioned at the second height where the second wire pattern 210 is formed in the second region II. In the second region II, the second gate electrode 220 is positioned at the first height where the first wire pattern 110 is formed in the first region I.

The first gate electrode 120 is formed on the substrate 100. The first gate electrode 120 extends lengthwise in a second direction Y1. The first gate electrode 120 is formed to surround the circumference of the first wire pattern 110 spaced apart from the substrate 100. The first gate electrode 120 is also formed in a space between the first wire pattern 110 and the substrate 100.

The second gate electrode 220 is formed on the substrate 100. The second gate electrode 220 extends lengthwise in a fourth direction Y2. The second gate electrode 220 is formed to surround the circumference of the second wire pattern 210 of the second gate electrode 220. In addition, since the second gate electrode 220 is formed on a top surface and sidewalls of the dummy wire pattern 211, it is positioned between the second wire pattern 210 and the dummy wire pattern 211.

The first gate electrode 120 and the second gate electrode 220 may include a conductive material. Each of the first gate electrode 120 and the second gate electrode 220 is a single layer, which is provided only for the sake of convenient explanation, but aspects of the present inventive concept are not limited thereto. For example, each of the first gate electrode 120 and the second gate electrode 220 may include a work function conductive layer for controlling a work function and a filling conductive layer for filling a space formed by the work function conductive layer.

Each of the first gate electrode 120 and the second gate electrode 220 may include, for example, at least one selected from the group consisting of TiN, WN, TaN, Ru, TiC, TaC, Ti, Ag, Al, TiAl, TiAlN, TiAlC, TaCN, TaSiN, Mn, Zr, W, and Al. Alternatively, each of the first gate electrode 120 and the second gate electrode 220 may include a non-metal element, such as Si, or SiGe. The first gate electrode 120 and the second gate electrode 220 may be formed by, for example, a replacement process, but aspects of the present inventive concept are not limited thereto.

The first gate spacers 140 are formed on opposite sidewalls of the first gate electrode 120 extending in the second direction Y1. The first gate spacers 140 are formed at opposite sides of the first wire pattern 110 while facing each other.

The second gate spacers 240 are formed on opposite sidewalls of the second gate electrode 220 extending in a fourth direction Y2. The second gate spacers 240 are formed at opposite sides of the second wire pattern 210 and the dummy wire pattern 211 while facing each other.

Referring to FIG. 4A, the first gate spacer 140 includes a first recess 140r recessed in a fifth direction Z1 from a bottom surface of the first gate spacer 140 adjacent to the substrate 100. The second gate spacer 240 includes a second recess 240r recessed in a sixth direction Z2 from a bottom surface of the second gate spacer 240 adjacent to the substrate 100.

Each of the first gate spacer 140 and the second gate spacer 240 may include, for example, at least one of silicon nitride (SiN), silicon oxynitride (SiON), silicon oxide (SiO$_2$), silicon oxycarbonitride (SiOCN) and combinations thereof. Each of the first gate spacer 140 and the second gate spacer 240 is a single layer, but aspects of the present inventive concept are not limited thereto. Each of the first gate spacer 140 and the second gate spacer 240 may have a multi-layered structure.

The first gate insulation layer 130 is formed between the first wire pattern 110 and the first gate electrode 120. The first gate insulation layer 130 is also formed between the first gate electrode 120 and the first gate spacer 140. In addition, the first gate insulation layer 130 is also formed between the substrate 100 and the first gate electrode 120.

The first gate insulation layer 130 is conformally formed along the circumference of the first wire pattern 110 disposed between the source/drain 150. The first gate insulation layer 130 is also interposed between the sidewalls of the first gate electrode 120 and the sidewalls of the first gate spacer 140. The first gate insulation layer 130 is also formed along a top surface of the substrate 100. The first gate insulation layer 130 is also formed along a portion of the surface of the first source/drain 150.

Since the first gate insulation layer 130 is formed between the sidewalls of the first gate electrode 120 and the sidewalls of the first gate spacer 140, one side surface of the first gate insulation layer 130 is formed along the sidewalls of the first gate electrode 120 and the other side surface of the first gate insulation layer 130 is formed along the sidewalls of the first gate spacer 140.

The second gate insulation layer 230 is formed between the second wire pattern 210 and the second gate electrode 220 and between the dummy wire pattern 211 and the second gate electrode 220. The second gate insulation layer 230 is formed between the second gate electrode 220 and the second gate spacers 240. In addition, the second gate insulation layer 230 is formed between the substrate 100 and the second gate electrode 220.

The second gate insulation layer 230 is conformally formed along the circumference of the second wire pattern 210. The second gate insulation layer 230 is also formed between the sidewalls of the second gate electrode 220 and the sidewalls of the second gate spacer 240. The second gate insulation layer 230 is also formed along the top surface of the substrate 100 and sidewalls and top surface of the dummy wire pattern 211. In addition, the second gate insulation layer 230 is also formed along a portion of the surface of the second source/drain 250.

Since the second gate insulation layer 230 is formed between the sidewalls of the second gate electrode 220 and the sidewalls of the second gate spacer 240, one side surface of the second gate insulation layer 230 is formed along the sidewalls of the second gate electrode 220 and the other side surface of the second gate insulation layer 230 is formed along the sidewalls of the second gate spacer 240.

Each of the first gate insulation layer 130 and the second gate insulation layer 230 may include a high-k film having a higher dielectric constant than silicon oxide. Each of the first gate insulation layer 130 and the second gate insulation layer 230 may include, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but the present inventive concept is not limited thereto.

The first transistor 105 further includes a first epitaxial seed layer 160 disposed at opposite sides of the first gate electrode 120 on the substrate 100. In addition, the second transistor 205 further includes a second epitaxial seed layer 260 disposed at opposite sides of the second gate electrode 220 on the substrate 100.

The second epitaxial seed layer 260 may be connected to the dummy wire pattern 211. For example, the second epitaxial seed layer 260 may be a part extending from the dummy wire pattern 211. However, a thickness of the second epitaxial seed layer 260 may be smaller than that of the dummy wire pattern 211.

Each of the first epitaxial seed layer 160 and the second epitaxial seed layer 260 may include the same material. Since the second epitaxial seed layer 260 is a part extending from the dummy wire pattern 211, the first epitaxial seed layer 160 and the second epitaxial seed layer 260 may include the same material with the dummy wire pattern 211.

The first epitaxial seed layer 160 and the second epitaxial seed layer 260 may be optional layers. Therefore, the first epitaxial seed layer 160 and the second epitaxial seed layer 260 may be omitted.

The first source/drain 150 is disposed at opposite sides of the first gate electrode 120. The first source/drain 150 is formed on the substrate 100 and is connected to the first wire pattern 110 that is a channel region.

The first source/drain 150 includes a first epitaxial layer 155 formed on the substrate 100. The first epitaxial layer 155 is formed on the first epitaxial seed layer 160. For example, the first epitaxial seed layer 160 is positioned between the first epitaxial layer 155 and the substrate 100.

The first epitaxial layer 155 includes first parts 155a and second parts 155b. The first wire pattern 110 is positioned between the first parts 155a of the first epitaxial layer 155. The first wire pattern 110 is directly connected to the first parts 155a of the first epitaxial layer 155.

The first gate insulation layer 130 and the first gate electrode 120 are positioned between the second parts 155b of the first epitaxial layer 155. The first wire pattern 110 is not positioned between the second parts 155b of the first epitaxial layer 155. The second parts 155b of the first epitaxial layer 155 is in contact with the first gate insulation layer 130. For example, the first gate spacers 140 need not be positioned between the second parts 155b of the first epitaxial layer 155 and the first gate insulation layer 130. Therefore, a portion of the first gate insulation layer 130 is in contact with the first epitaxial layer 155.

The second source/drain 250 is disposed at opposite sides of the second gate electrode 220. The second source/drain 250 is formed on the substrate 100 and is connected to the second wire pattern 210 that is a channel region. In addition, the second source/drain 250 is connected to the dummy wire pattern 211.

The second source/drain 250 includes a second epitaxial layer 255 formed on the substrate 100. The second epitaxial layer 255 is formed on the second epitaxial seed layer 260. For example, the second epitaxial seed layer 260 is positioned between the second epitaxial layer 255 and the substrate 100.

The second epitaxial layer 255 includes first parts 255a and second parts 255b. The second wire pattern 210 is positioned between the first parts 255a of the second epitaxial layer 255. The second wire pattern 210 is directly connected to the first parts 255a of the second epitaxial layer 255.

The second gate insulation layer 230 and the second gate electrode 220 are positioned between the second parts 255b of the second epitaxial layer 255. The second wire pattern 210 is not positioned between the second parts 255b of the second epitaxial layer 255. The second parts 255b of the second epitaxial layer 255 are in direct contact with the second gate insulation layer 230. For example, the second gate spacer 240 is positioned between the second parts 255b of the second epitaxial layer 255 and the second gate insulation layer 230. Therefore, a portion of the second gate insulation layer 230 is in contact with the second epitaxial layer 255.

An outer circumferential surface of the first epitaxial layer 155 and an outer circumferential surface of the second epitaxial layer 255 may have various shapes. For example, each of the outer circumferential surface of the first epitaxial layer 155 and the outer circumferential surface of the second epitaxial layer 255 may be at least one shape of a diamond, a circle and a rectangle. In FIG. 1, a diamond shape (or a pentagonal or hexagonal shape) is illustrated by way of example.

For example, the first epitaxial layer 155 may include a material capable of applying compressive stress to the first wire pattern 110 used as a channel region of a PMOS. The first epitaxial layer 155 may include a material having greater lattice constant than the first wire pattern 110. For example, if the first wire pattern 110 includes SiGe, the first epitaxial layer 155 may include SiGe having a higher Ge content than the first wire pattern 110.

For example, the second epitaxial layer 255 may include a material capable of applying tensile stress to the second wire pattern 210 used as a channel region of an NMOS or the same material with the second wire pattern 210. The second epitaxial layer 255 may include a material having a lattice constant smaller than or equal to that of the second wire pattern 210. If the second wire pattern 210 includes Si, the second epitaxial layer 255 may be Si or a material having a smaller lattice constant than Si (e.g., SiC).

FIG. 4A illustrates a case in which a cross section of the first wire pattern 110 and a portion of the first gate insulation layer 130 are exposed through the first recess 140r included in the first gate spacer 140 and a case in which a cross section of the second wire pattern 210, a cross section of the dummy wire pattern 211 and a portion of the second gate insulation layer 230 are exposed through the second recess 240r included in the second gate spacer 240.

FIG. 4B illustrates an alternative example of FIG. 4A, where a portion of the first epitaxial layer 155 and a portion of the second epitaxial layer 255 are recessed into interior sides of the first gate spacer 140 and the second gate spacer 240, respectively.

In FIGS. 2 and 4A, the first wire pattern 110 and the portion of the first gate insulation layer 130 exposed through the first recess 140r are in contact with the first epitaxial layer 155. For example, since the portion of the first gate insulation layer 130 is in direct contact with the first epitaxial layer 155, the first gate spacers 140 is not positioned between the portion of the first gate insulation layer 130 exposed through the first recess 140r and the first gate insulation layer 130.

Alternatively, in FIG. 4B, the portion of the first epitaxial layer 155 may be formed in the first gate spacers 140 so that the first gate spacer 140 is not positioned between the portion of the first gate insulation layer 130 and the first epitaxial layer 155. In FIG. 4A, the first gate spacer 140 is positioned between the portion of the first gate insulation layer 130 and the first epitaxial layer 155.

Like the first gate spacer 140 which is not positioned between the first epitaxial layer 155 and the first gate insulation layer 130, the second gate spacer 240, in FIG. 4B, is not positioned between the portion of the second gate insulation layer 230 and the second epitaxial layer 255.

In FIGS. 1, 2 4A and 4B, the first gate insulation layer 130 is entirely formed along the sidewalls of the first gate electrode 120, and the second gate insulation layer 230 is entirely formed along the sidewalls of the second gate electrode 220.

In FIG. 4B, the first gate spacer 140 is not positioned between a portion of the first gate insulation layer 130 and the first epitaxial layer 155, and thus the portion of the first gate insulation layer 130 need not be in contact with the first gate spacer 140. The portion of the first gate insulation layer 130 may be in contact with the first epitaxial layer 155. Similarly, the second gate spacer 240 is not positioned between a portion of the second gate insulation layer 230 and the second epitaxial layer 255, and thus the portion of the second gate insulation layer 230 need not be in contact with the second gate spacer 240. The portion of the second gate insulation layer 230 may be in contact with the second epitaxial layer 255.

The PMOS formed in the first region I not including a dummy wire pattern and the NMOS formed in the second region II including a dummy wire pattern are illustrated in FIGS. 1 to 4B, but aspects of the present inventive concept are not limited thereto. The PMOS formed in the first region I includes a dummy wire pattern, and the NMOS formed in the second region II need not include a dummy wire pattern.

In the following description, it is assumed that the cross-sectional views shown in FIG. 1, taken along lines C-C and F-F, are similar to those shown in FIG. 4A.

Figure 5:
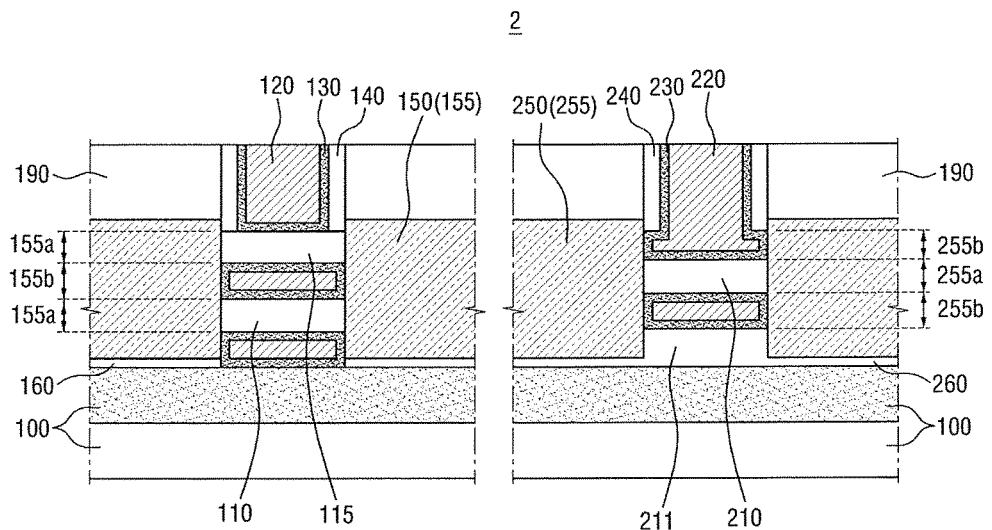
FIGS. 5 to 7 are diagrams illustrating a semiconductor device according to an exemplary embodiment of the present inventive concept.
Figure 6:
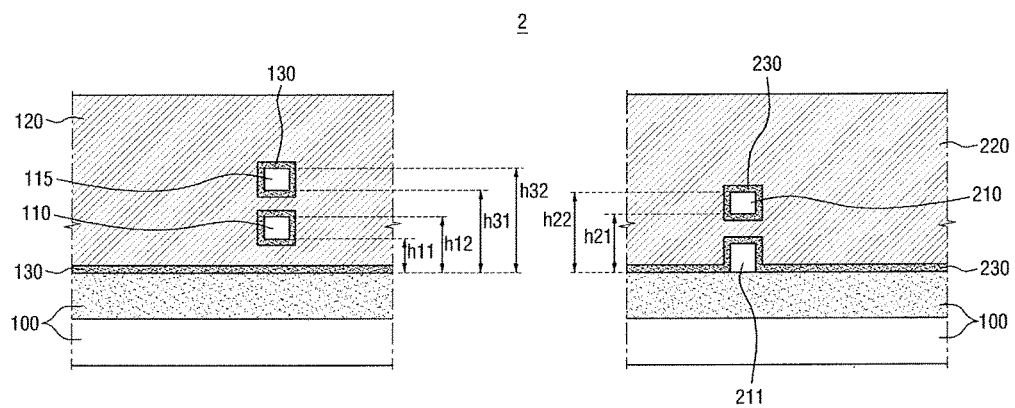
Figure 7:
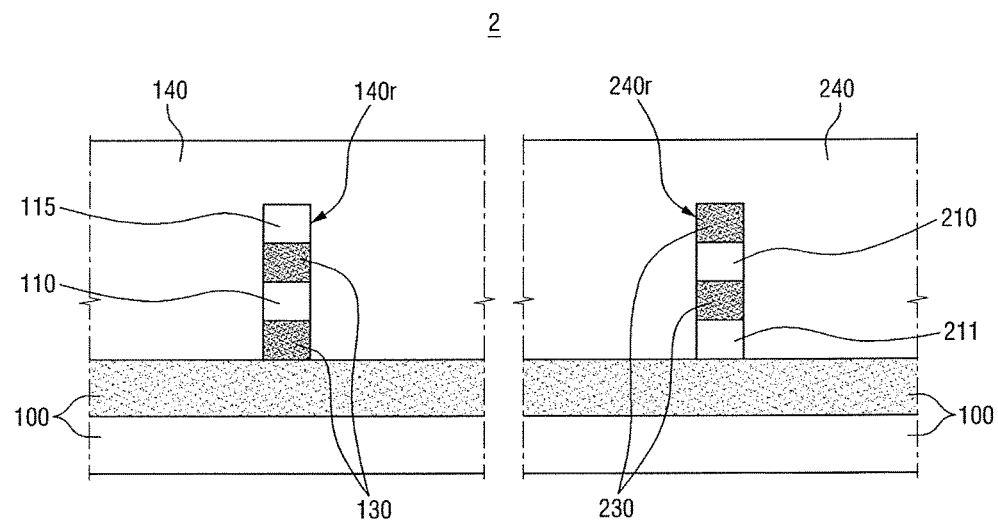

FIGS. 5 to 7 are diagrams illustrating a semiconductor device according to an exemplary embodiment of the present inventive concept. For brevity, the following description will focus on differences between the present embodiment and the previous embodiment shown in FIGS. 1 to 4.

Referring to FIGS. 5 to 7, the semiconductor device 2 further includes a third wire pattern 115 formed in a first region I. For example, a first transistor 105 formed in the first region I further includes a third wire pattern 115.

The third wire pattern 115 is formed on the first wire pattern 110. The third wire pattern 115 extends in a first direction X1. The third wire pattern 115 is spaced apart from the first wire pattern 110.

The third wire pattern 115 may include the same material with the first wire pattern 110. For example, the third wire pattern 115 may include one of SiGe and Ge, but aspects of the present inventive concept are not limited thereto.

In the semiconductor device 2, in view of a top surface of the substrate 100, a height at which the third wire pattern 115 is formed is different from a height at which the second wire pattern 210 is formed. For example, in view of the top surface of the substrate 100, the height at which the third wire pattern 115 is formed is greater than the height at which the second wire pattern 210 is formed.

A height ranging from the top surface of the substrate 100 to a bottommost part of the third wire pattern 115 may be referred to as a third_first height h31 and a height ranging from the top surface of the substrate 100 to a topmost part of the third wire pattern 115 may be referred to as a third_second height h32. Here, a third height ranging from the top surface of the substrate 100 to the third wire pattern 115 may be a median value of the third_first height h31 and the third_second height h32.

The height h31 ranging from the top surface of the substrate 100 to the bottommost part of the third wire pattern 115 may be substantially equal to or greater than the height h22 ranging from the top surface of the substrate 100 to the topmost part of the second wire pattern 210. For example, in the second region II, the second wire pattern 210 and the dummy wire pattern 211 are not positioned between the height h31 and the height h32.

In addition, in the first region I, the first wire pattern 110 and the third wire pattern 115 are not positioned between the height h21 and the height h22.

In addition, in the second region II, no wire pattern used as a channel region is positioned between the height h31 and the height h32. In the second region II, the second gate electrode 220 is positioned at the third height where the third wire pattern 115 is formed in the first region I.

Therefore, the second height ranging from the top surface of the substrate 100 to the second wire pattern 210 is greater than the first height ranging from the top surface of the substrate 100 to the first wire pattern 110, but is smaller than third height ranging from the top surface of the substrate 100 to the third wire pattern 115.

In addition, the second wire pattern 210 is positioned between the height h31 ranging from the top surface of the substrate 100 to the bottommost part of the third wire pattern 115 and the height h12 ranging from the top surface of the substrate 100 to the topmost part of the third wire pattern 115.

For example, the height h31 ranging from the top surface of the substrate 100 to the bottommost part of the third wire pattern 115 may be substantially equal to or greater than the height h22 ranging from the top surface of the substrate 100 to the topmost part of the second wire pattern 210. In addition, the height h12 ranging from the top surface of the substrate 100 to the topmost part of the first wire pattern 110 may be substantially equal to or greater than the height h21 ranging from the top surface of the substrate 100 to the bottommost part of the second wire pattern 210.

In FIG. 5, the first wire pattern 110 and the third wire pattern 115 are formed in the first region I and the second wire pattern 210 is formed in the second region II. However, the first wire pattern 110, the second wire pattern 210 and the third wire pattern 115 are disposed at different heights from the top surface of the substrate 100.

The first gate electrode 120 is formed to entirely surround the circumference of the first wire pattern 110 spaced apart from the substrate 100 and the circumference of the third wire pattern 115.

The first gate insulation layer 130 is formed between the third wire pattern 115 and the first gate electrode 120 and between the first wire pattern 110 and the first gate electrode 120. The first gate insulation layer 130 is conformally formed along the circumference of the first wire pattern 110 and the circumference of the third wire pattern 115.

The first source/drain 150 is disposed at opposite sides of the first wire pattern 110 and the third wire pattern 115. A part of the first epitaxial layer 155 included in the first source/drain 150 is directly connected to the first wire pattern 110 and the third wire pattern 115. For example, the first wire pattern 110 and the third wire pattern 115 are directly connected to the first parts 155a of the first epitaxial layer 155.

In the semiconductor device 2, the number of wire patterns 110 and 115 entirely surrounded by the first gate electrode 120 is different from the number of wire patterns 210 entirely surrounded by the second gate electrode 220.

Figure 8:
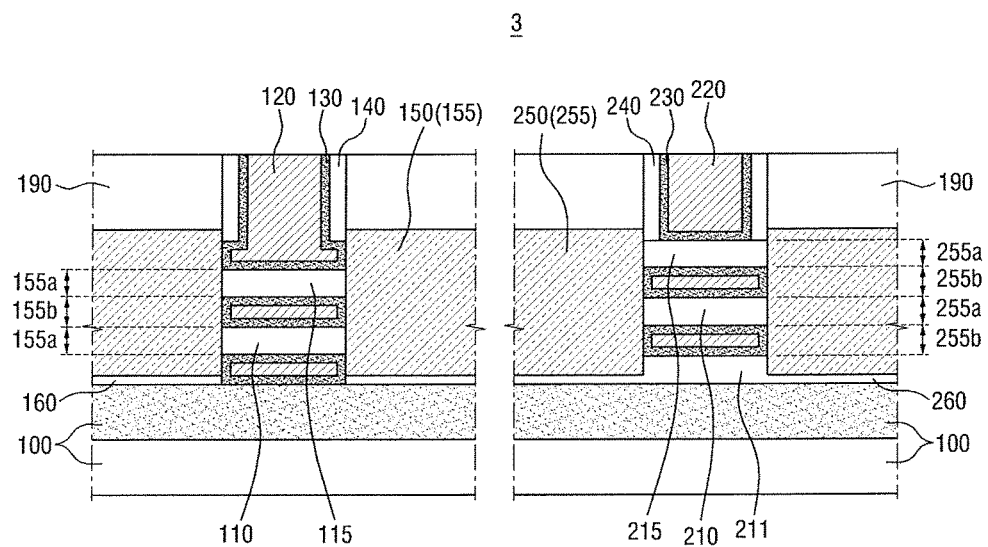
FIGS. 8 to 10 are diagrams illustrating a semiconductor device according to an exemplary embodiment of the present inventive concept.
Figure 9:
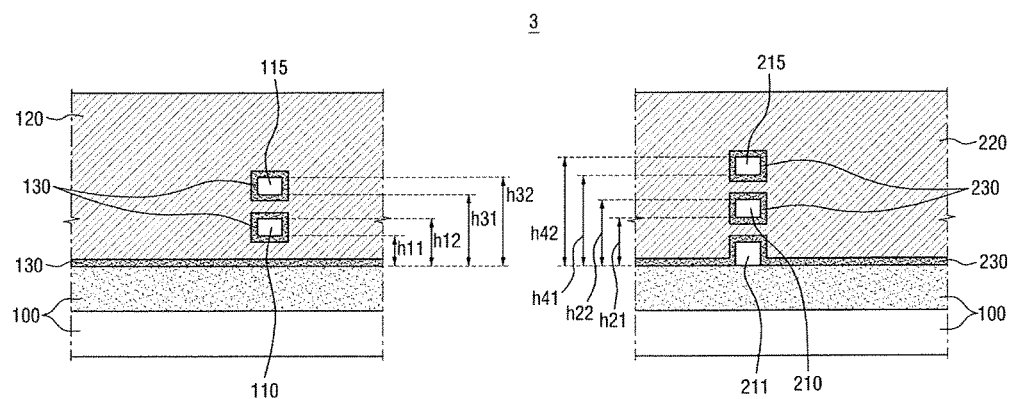
Figure 10:
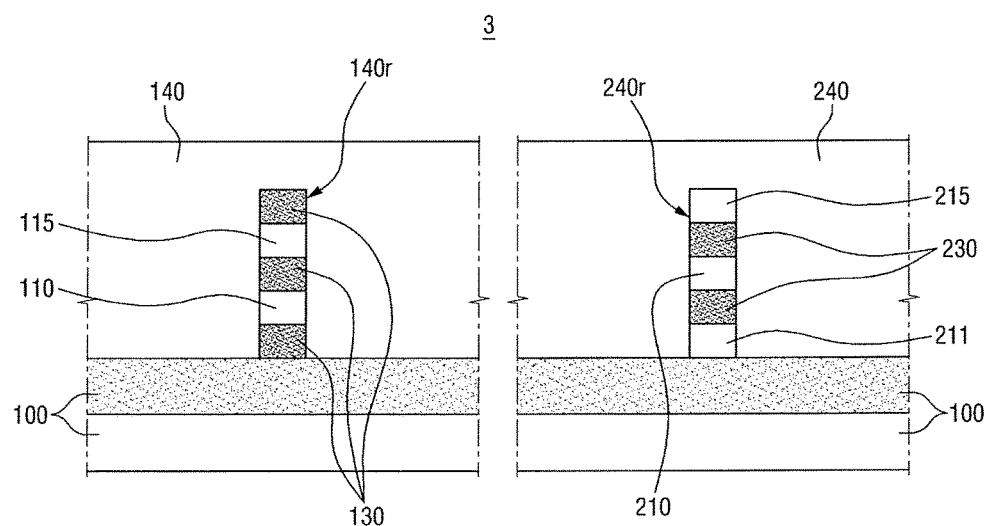

FIGS. 8 to 10 are diagrams illustrating a semiconductor device according to an exemplary embodiment of the present inventive concept. For brevity, the following description will focus on differences between the present embodiment and the previous embodiment shown in FIGS. 5 to 7.

Referring to FIGS. 8 to 10, the semiconductor device 3 further includes a fourth wire pattern 215 formed in the second region II. For example, a second transistor 205 formed in the second region II further includes the fourth wire pattern 215.

The fourth wire pattern 215 is formed on the second wire pattern 210. The fourth wire pattern 215 extends in a third direction X2. The fourth wire pattern 215 is spaced apart from the second wire pattern 210.

The fourth wire pattern 215 may include the same material with the second wire pattern 210. For example, the fourth wire pattern 215 may include one of Si and a III-V group compound semiconductor material, but the present inventive concept is not limited thereto.

In the semiconductor device 3, in view of the top surface of the substrate 100, a height at which the fourth wire pattern 215 is formed is different from a height at which the third wire pattern 115 is formed. For example, in view of the top surface of the substrate 100, the height at which the fourth wire pattern 215 is formed is greater than the height at which the third wire pattern 115 is formed.

A height ranging from the top surface of the substrate 100 to a bottommost part of the fourth wire pattern 215 may be referred to as a height h41 and a height ranging from the top surface of the substrate 100 to a topmost part of the fourth wire pattern 215 may be referred to as a height h42. Here, a fourth height ranging from the top surface of the substrate 100 to the fourth wire pattern 215 may be a median value of the height h41 and the height h42.

The height h41 ranging from the top surface of the substrate 100 to the bottommost part of the fourth wire pattern 215 may be substantially equal to or greater than a height h32 ranging from the top surface of the substrate 100 to a topmost part of the third wire pattern 115. For example, in the first region I, the first wire pattern 110 and the third wire pattern 115 are not positioned between the height h41 and the height h42.

In addition, in the first region I, no wire pattern used as a channel region is positioned between the height h41 and the height h42. In the first region I, the first gate electrode 120 is positioned at the fourth height where the fourth wire pattern 215 is formed in the second region II.

Therefore, the third height ranging from the top surface of the substrate 100 to the third wire pattern 115 is greater than the second height ranging from the top surface of the substrate 100 to the second wire pattern 210, but is smaller than the fourth height ranging from the top surface of the substrate 100 to the fourth wire pattern 215.

In addition, the third wire pattern 115 is positioned between the height h41 ranging from the top surface of the substrate 100 to the bottommost part of the fourth wire pattern 215 and the height h22 ranging from the top surface of the substrate 100 to the topmost part of the second wire pattern 210.

For example, the height h41 ranging from the top surface of the substrate 100 to the bottommost part of the fourth wire pattern 215 may be substantially equal to or greater than the height h32 ranging from the top surface of the substrate 100 to the topmost part of the third wire pattern 115. In addition, the height h22 ranging from the top surface of the substrate 100 to the topmost part of the second wire pattern 210 may be substantially equal to or smaller than the height h31 ranging from the top surface of the substrate 100 to the bottommost part of the third wire pattern 115.

In FIG. 8, the first wire pattern 110 and the third wire pattern 115 are formed in the first region I and the second wire pattern 210 and the fourth wire pattern 215 are formed in the second region II. However, the first wire pattern 110, the second wire pattern 210, the third wire pattern 115 and the fourth wire pattern 215 are disposed at different heights from the top surface of the substrate 100.

The second gate electrode 220 is formed to entirely surround the circumferences of the second wire pattern 210 and the fourth wire pattern 215 spaced apart from each other.

The second gate insulation layer 230 is formed between the second wire pattern 210 and the second gate electrode 220 and between the fourth wire pattern 215 and the second gate electrode 220. The second gate insulation layer 230 is conformally formed along the circumference of the second wire pattern 210 and the circumference of the fourth wire pattern 215.

The second source/drain 250 is disposed at opposite sides of the second wire pattern 210 and the fourth wire pattern 215. A part of the second epitaxial layer 255 included in the second source/drain 250 is directly connected to the second wire pattern 210 and the fourth wire pattern 215. For example, the second wire pattern 210 and the fourth wire pattern 215 are directly connected to the first parts 255*a* of the second epitaxial layer 255.

In the semiconductor device 3, the number of wire patterns 110 and 115 entirely surrounded by the first gate electrode 120 is equal to the number of wire patterns 210 and 215 entirely surrounded by the second gate electrode 220. For example, each of the first gate electrode 120 and the second gate electrode 220 entirely surrounds circumferences a plurality of wire patterns.

Figure 11:
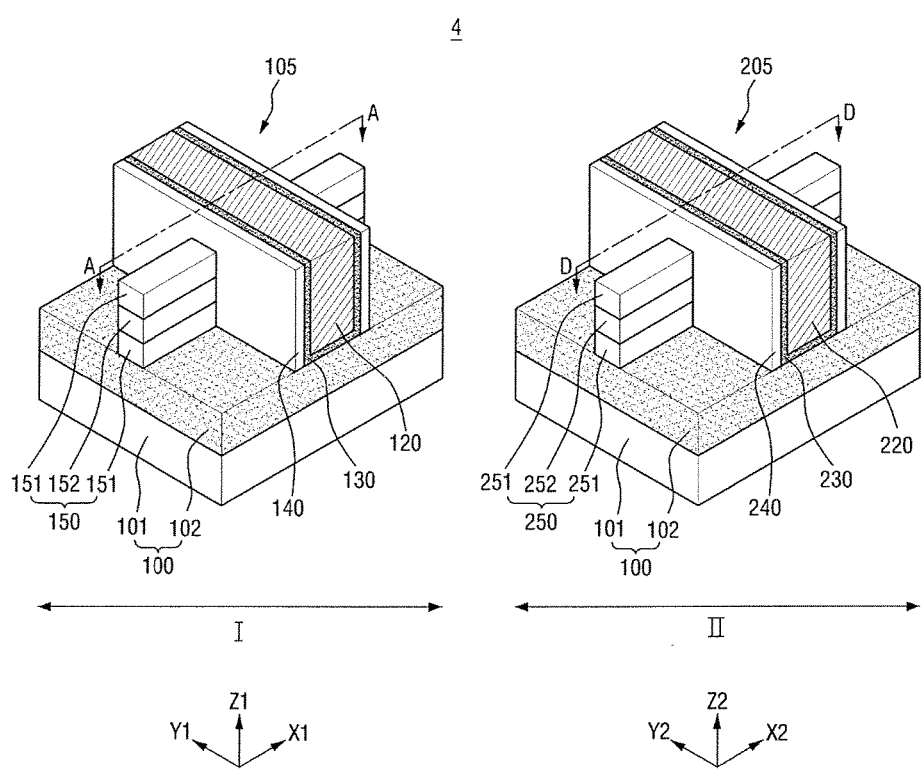
FIG. 11 is a diagram illustrating a semiconductor device according to an exemplary embodiment of the present inventive concept.
Figure 12:
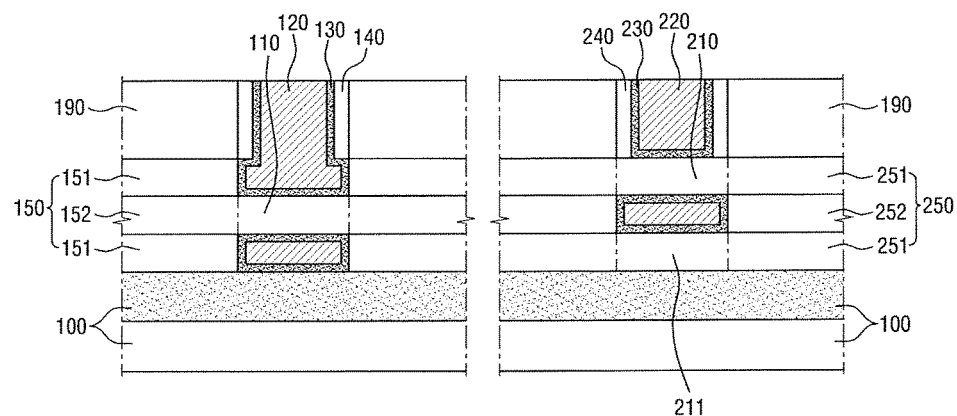
FIG. 12 is a cross-sectional view taken along lines A-A and D-D of FIG. 11.

FIG. 11 is a diagram illustrating a semiconductor device according to an exemplary embodiment of the present inventive concept and FIG. 12 is a cross-sectional view taken along lines A-A and D-D of FIG. 11. For brevity, the following description will focus on differences between the present embodiment and the previous embodiment shown in FIGS. 1 to 4B.

Referring to FIGS. 11 and 12, in the semiconductor device 4, a first source/drain 150 includes first semiconductor patterns 151 and second semiconductor patterns 152 sequentially stacked on a substrate 100. A top surface of the first source/drain 150 corresponds to, for example, the first semiconductor patterns 151.

In addition, a second source/drain 250 includes third semiconductor patterns 251 and fourth semiconductor patterns 252 sequentially stacked on the substrate 100. A top surface of the second source/drain 250 corresponds to, for example, the third semiconductor patterns 251.

The second semiconductor patterns 152 are directly connected to the first wire pattern 110. For example, the second semiconductor patterns 152 are parts extending from the first wire pattern 110. In addition, the second semiconductor patterns 152 and the first wire pattern 110 are formed at the same level. Here, the expression "being formed at the same level" is used to mean being formed by the same fabrication process.

The first semiconductor patterns 151 are disposed at opposite sides of a first gate electrode 120 in the first direction X. The first gate electrode 120 and a first gate insulation layer 130 are disposed between the first semiconductor patterns 151.

The third semiconductor patterns 251 being in contact with the substrate 100 is directly connected to the dummy wire pattern 211 and the third semiconductor patterns 251 spaced apart from the substrate 100 is directly connected to the second wire pattern 210. For example, the third semiconductor patterns 251 are parts extending from the dummy wire pattern 211 and the second wire pattern 210.

The fourth semiconductor patterns 252 are disposed at opposite sides of the second gate electrode 220 in a third direction X2. The second gate electrode 220, and the second gate insulation layer 230 is disposed between the fourth semiconductor patterns 252.

In the semiconductor device 4, the first semiconductor patterns 151 and the third semiconductor patterns 251 include the same material and the second semiconductor patterns 152, and the fourth semiconductor patterns 252 include the same material.

In addition, the second semiconductor patterns 152 may include the same material with the first wire pattern 110 and the third semiconductor patterns 251 may include the same material with the second wire pattern 210.

A portion of the first gate insulation layer 130 is in contact with the first source/drain 150. In addition, a portion of the second gate insulation layer 230 is in contact with the second source/drain 250. In the semiconductor device 4, the portion of the first gate insulation layer 130 is in contact with the first semiconductor patterns 151 of the first source/drain 150, and the portion of the second gate insulation layer 230 is in contact with the fourth semiconductor patterns 252 of the second source/drain 250.

A fabricating method of a semiconductor device according to an exemplary embodiment of the present inventive concept will be described with reference to FIGS. 13 to 27. The semiconductor device fabricated by the fabricating method shown in FIGS. 13 to 27 may be the same with the semiconductor device 3 shown in FIGS. 8 to 10.

FIGS. 13 to 27 are diagrams illustrating intermediate process steps in a fabricating method of a semiconductor device according to an exemplary embodiment of the present inventive concept. Specifically, FIG. 20B is a cross-sectional view taken along lines G-G and H-H of FIG. 20A.

Figure 13:
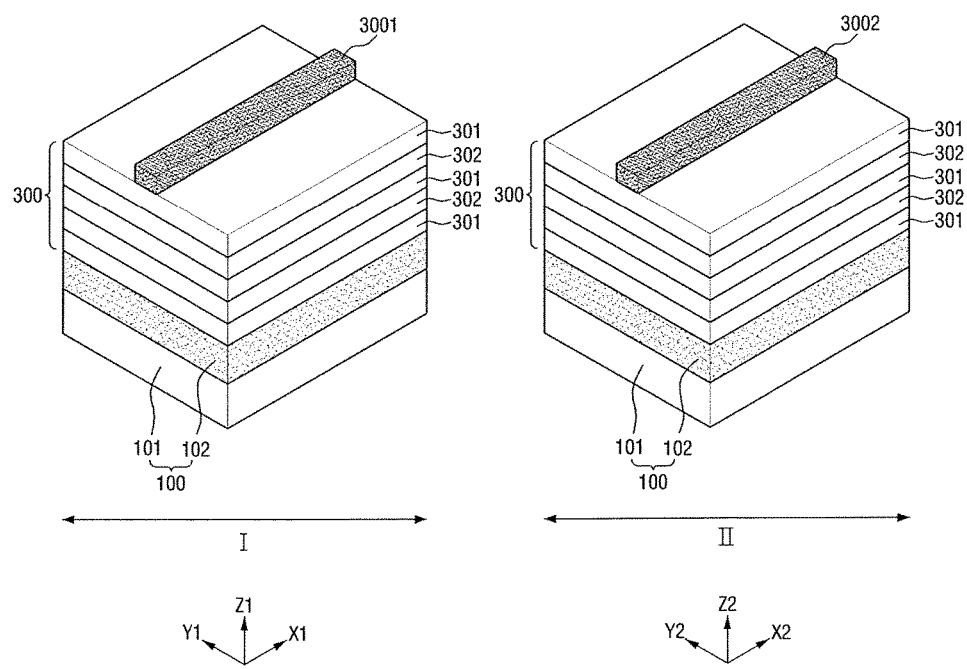
FIGS. 13 to 19, 20A, 20B and 21 to 27 are diagrams illustrating intermediate process steps in a fabricating method of a semiconductor device according to an exemplary embodiment of the present inventive concept.

Referring to FIG. 13, a stacked structure 300 having a first semiconductor layer 301 and a second semiconductor layer 302 alternately stacked one on the other is formed on a substrate 100.

For example, the substrate 100 includes a lower substrate 101 as a semiconductor substrate and an upper substrate 102 as an insulation layer substrate.

In addition, in the stacked structure 300, the first semiconductor layer 301 being in contact with the substrate 100 may be bonded to the substrate 100 by, for example, wafer bonding, but aspects of the present inventive concept are not limited thereto.

The second semiconductor layer 302 and the first semiconductor layer 301 are alternately formed on the first semiconductor layer 301 being in contact with the substrate 100. The first semiconductor layer 301 and the second semiconductor layer 302 are formed by, for example, epitaxial growth, but aspects of the present inventive concept are not limited thereto. A topmost layer of the stacked structure 300 is, for example, the first semiconductor layer 301, but aspects of the present inventive concept are not limited thereto.

The first semiconductor layer 301 and the second semiconductor layer 302 include different materials. The first semiconductor layer 301 and the second semiconductor layer 302 may include materials having etching selectivity with respect to each other. The first semiconductor layer 301 may include, for example, Si or a III-V group compound semiconductor material, but aspects of the present inventive concept are not limited thereto. The second semiconductor layer 302 may include, for example, one of SiGe and Ge, but aspects of the present inventive concept are not limited thereto.

Next, in the first region I, a first mask pattern 3001 extending in the first direction X1 is formed on the stacked structure 300. In addition, in the second region II, a second mask pattern 3002 extending in a third direction X2 is formed on the stacked structure 300.

Each of the first mask pattern 3001 and the second mask pattern 3002 may include, for example, at least one of a silicon oxide layer, a silicon nitride layer and a silicon oxynitride layer.

Figure 14:
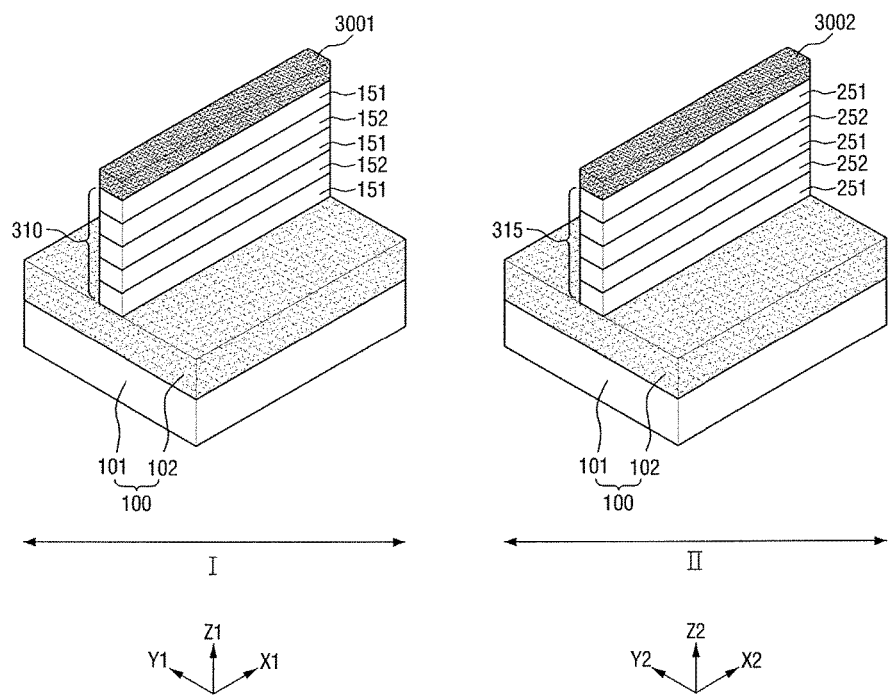

Referring to FIG. 14, the stacked structure 300 is etched using the first mask pattern 3001 and the second mask pattern 3002 as masks, thereby forming a first fin type structure 310 and a second fin type structure 315. For example, the stacked structure 300 is etched until the top surface of the substrate 100 is exposed, thereby forming the first fin type structure 310 and the second fin type structure 315.

The first fin type structure 310 is formed on the first region I and the second fin type structure 315 is formed on the second region II. The first fin type structure 310 extends lengthwise in the first direction X1 and the second fin type structure 315 extends lengthwise in the third direction X2.

The first fin type structure 310 includes first semiconductor patterns 151 and second semiconductor patterns 152 alternately stacked on the substrate 100, and the second fin type structure 315 includes third semiconductor patterns 251 and fourth semiconductor patterns 252 alternately stacked on the substrate 100.

Since the first semiconductor patterns 151 and the third semiconductor patterns 251 are formed by etching the first semiconductor layer 301, they may include the same material. In addition, the second semiconductor patterns 152 and the fourth semiconductor patterns 252 are formed by etching the second semiconductor layer 302, they may include the same material.

Next, the first mask pattern 3001 and the second mask pattern 3002 positioned on the first fin type structure 310 and the second fin type structure 315 are removed.

Figure 15:
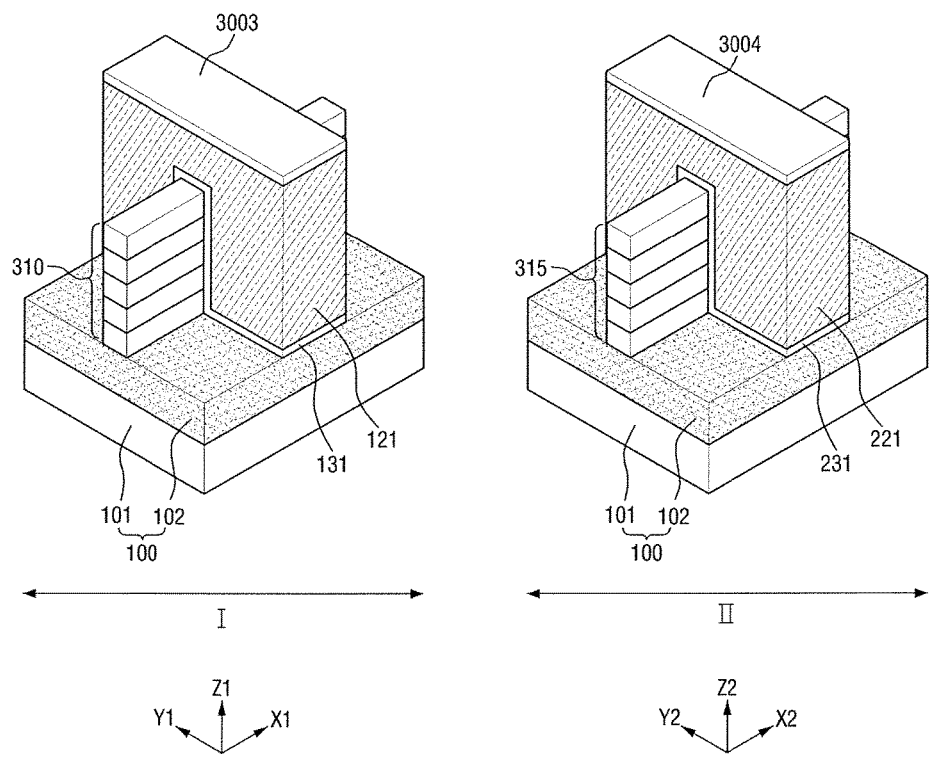

Referring to FIG. 15, an etching process is performed using a third mask pattern 3003, thereby forming a first dummy gate insulation layer 131 and a first dummy gate electrode 121 crossing the first fin type structure 310 and extending in the second direction Y1.

In addition, an etching process is performed using a fourth mask pattern 3004, thereby forming a second dummy gate insulation layer 231 and a second dummy gate electrode 221 crossing the second fin type structure 315 and extending in a fourth direction Y2.

In such a manner, the first dummy gate electrode 121 is formed on the first fin type structure 310, and the second dummy gate electrode 221 is formed on the second fin type structure 315.

Each of the first dummy gate insulation layer 131 and the second dummy gate insulation layer 231 may be a silicon oxide layer, and each of the first dummy gate electrode 121 and the second dummy gate electrode 221 may include polysilicon or amorphous silicon, but aspects of the present inventive concept are not limited thereto.

Figure 16:
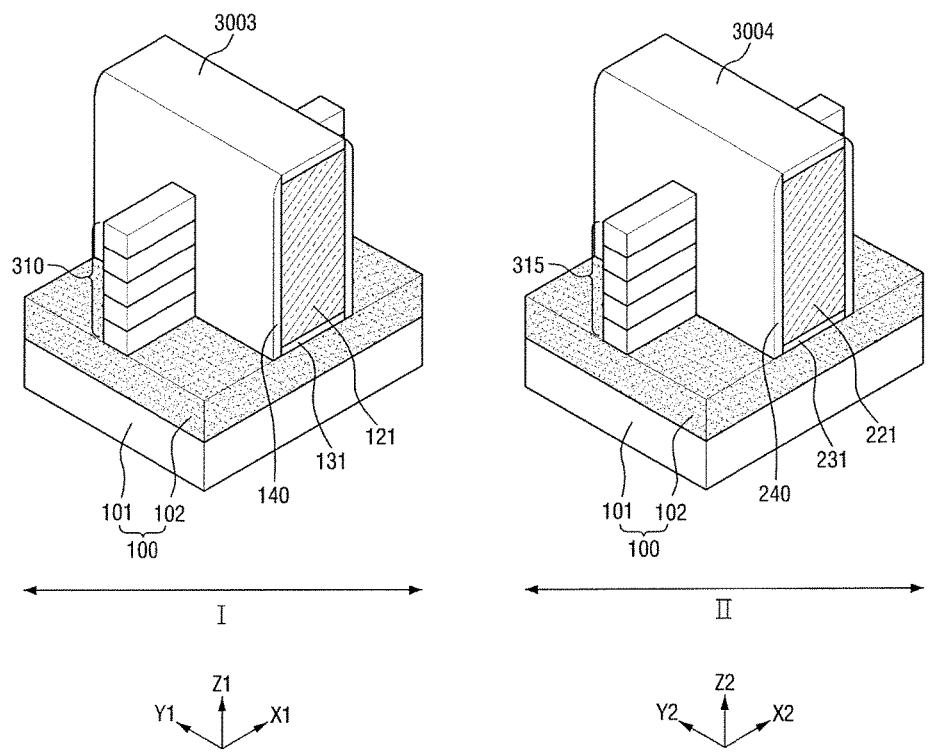

Referring to FIG. 16, first gate spacers 140 are formed on sidewalls of the first dummy gate electrode 121. In addition, second gate spacers 240 are formed on sidewalls of the second dummy gate electrode 221.

For example, a spacer layer is formed on the substrate 100, the spacer layer covering the first dummy gate electrode 121, the second dummy gate electrode 221, the first fin type structure 310 and the second fin type structure 315. Thereafter, the spacer layer is etched back, thereby forming the first gate spacers 140 on the sidewalls of the first dummy gate electrode 121 and the second gate spacers 240 on the sidewalls of the second dummy gate electrode 221.

Figure 17:
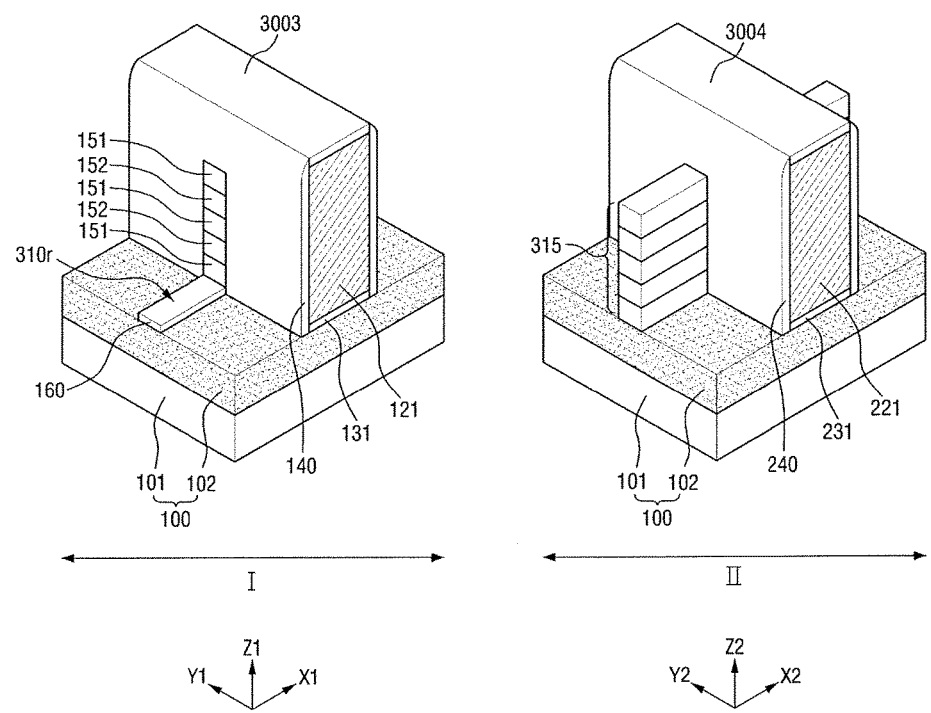

Referring to FIG. 17, the first fin type structure 310 exposed to opposite sides of the first gate spacers 140 are removed, thereby forming a third recess 310r in the first fin type structure 310.

While forming the third recess 310r, portions of the first semiconductor patterns 151 being in contact with the substrate 100 are allowed to remain, thereby forming the first epitaxial seed layer 160, but aspects of the present inventive concept are not limited thereto. For example, the first semiconductor patterns 151 being in contact with the substrate 100 are completely removed to expose the top surface of the substrate 100.

The first semiconductor patterns 151 and the second semiconductor patterns 152 alternately stacked on the substrate 100 are exposed through lateral surfaces of the third recess 310r.

When the third recess 310r is formed in the first fin type structure 310, the second region II is covered using a photoresist pattern, but aspects of the present inventive concept are not limited thereto.

Figure 18:
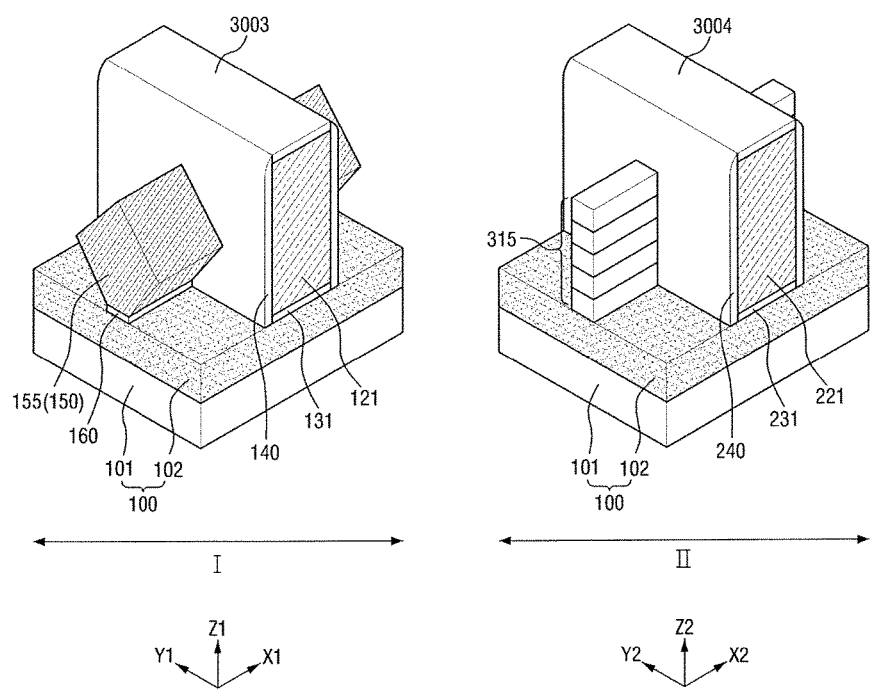

Referring to FIG. 18, a first epitaxial layer 155 filling the third recess 310r is formed on the first fin type structure 310. For example, a first source/drain 150 is formed at opposite sides of the first dummy gate electrode 121.

The first epitaxial layer 155 may be formed by epitaxial growth. The first epitaxial layer 155 may be grown using the first epitaxial seed layer 160 and the first semiconductor patterns 151 and the second semiconductor patterns 152 exposed through the lateral surfaces of the third recess 310r as seed layers. If the first epitaxial seed layer 160 is absent, the first epitaxial layer 155 may be grown using the first semiconductor patterns 151 and the second semiconductor patterns 152 exposed through the lateral surfaces of the third recess 310r as seed layers.

Figure 19:
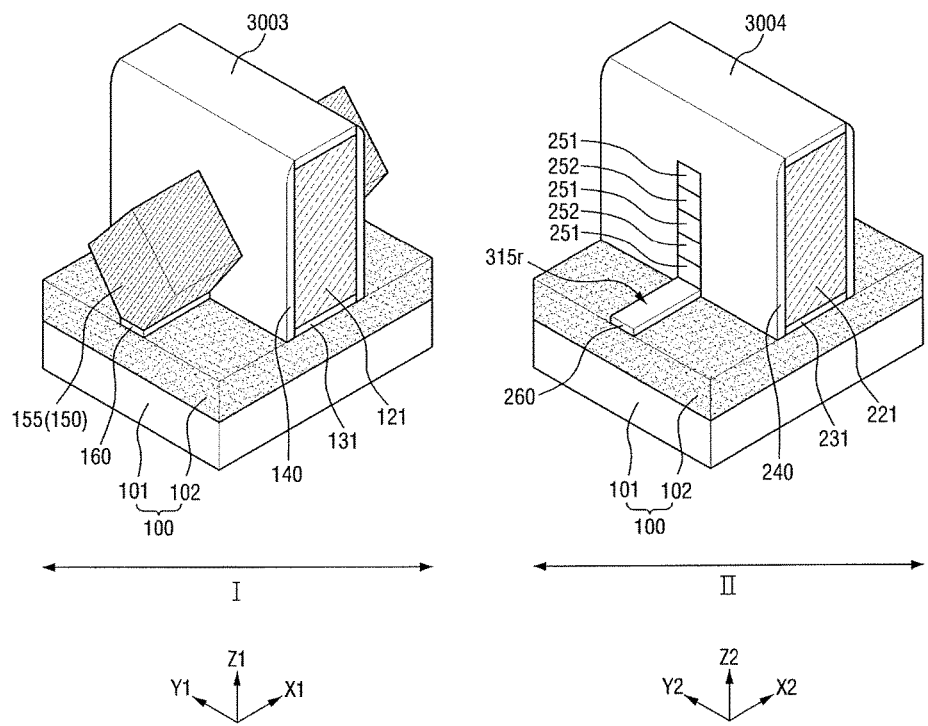

Referring to FIG. 19, the second dummy gate electrode 221 and the second fin type structure 315 exposed to opposite sides of the second gate spacers 240 are removed, thereby forming a fourth recess 315r in the second fin type structure 315.

While forming the fourth recess 315r, portions of the third semiconductor patterns 251 being in contact with the substrate 100 are allowed to remain, thereby forming the second epitaxial seed layer 260, but aspects of the present inventive concept are not limited thereto. For example, the third semiconductor patterns 251 being in contact with the substrate 100 are completely removed to expose the top surface of the substrate 100.

The third semiconductor patterns 251 and the fourth semiconductor patterns 252 alternately stacked on the substrate 100 are exposed through lateral surfaces of the fourth recess 315r.

When the second fin type structure 315 is formed in the fourth recess 315r, the first region I is covered using a photoresist pattern, but aspects of the present inventive concept are not limited thereto.

Figure 20A:
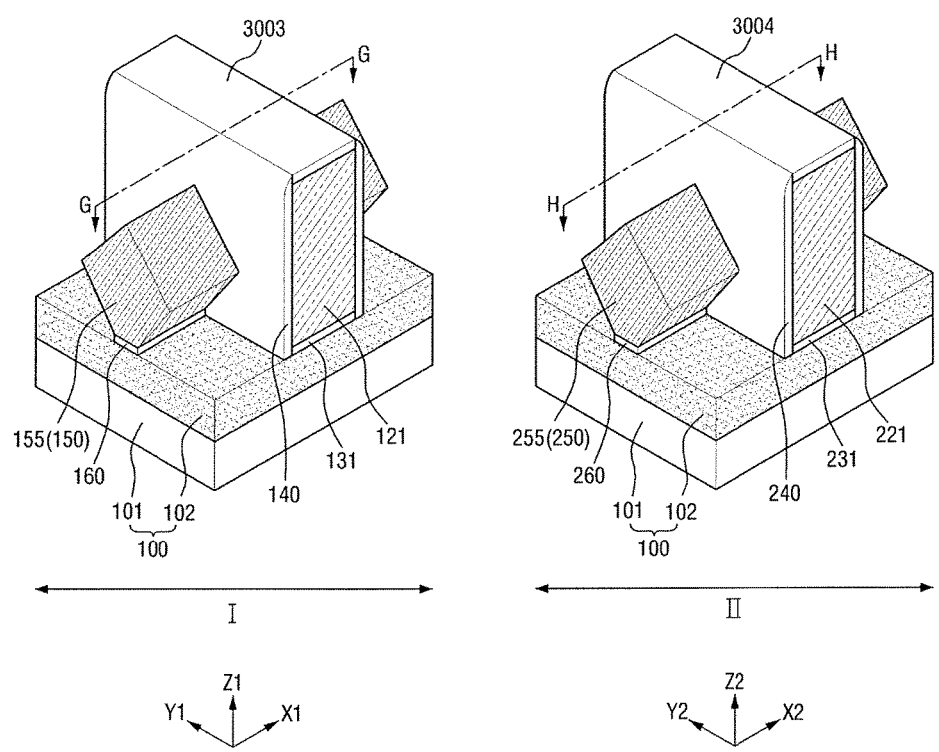
Figure 20B:
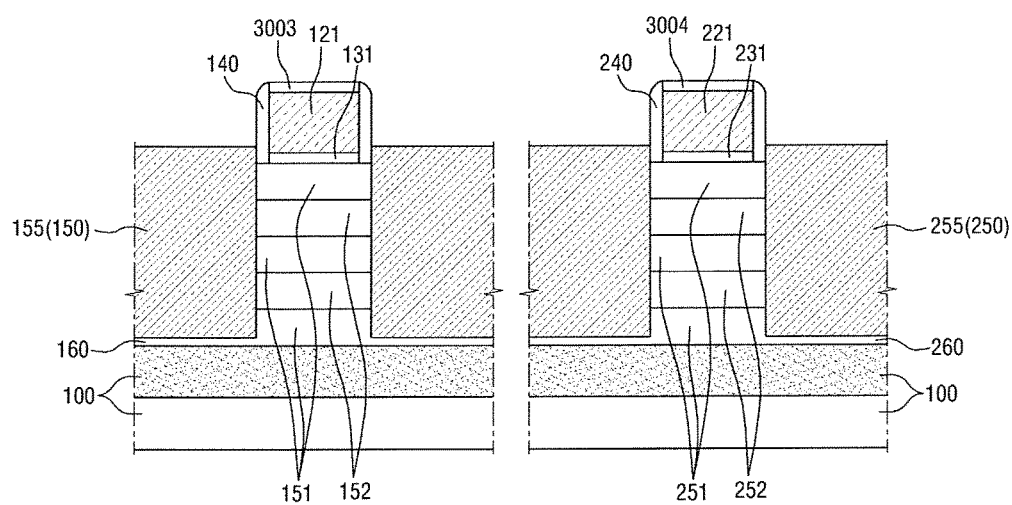

Referring to FIGS. 20A and 20B, a second epitaxial layer 255 filling the fourth recess 315r is formed on the second fin type structure 315. For example, a second source/drain 250 is formed at opposite sides of the second dummy gate electrode 221.

The second epitaxial layer 255 may be grown using the second epitaxial seed layer 260, the third semiconductor patterns 251 and the fourth semiconductor patterns 252 exposed through lateral surfaces of the fourth recess 315r as seed layers. If the second epitaxial seed layer 260 is absent, the second epitaxial layer 255 may be grown using the third semiconductor patterns 251 and the fourth semiconductor patterns 252 exposed through the lateral surfaces of the fourth recess 315r as seed layers.

In FIG. 20B, the first epitaxial layer 155 is in contact with the first semiconductor patterns 151 and the second semiconductor patterns 152 positioned under the first dummy gate electrode 121 and the first gate spacers 140. The second epitaxial layer 255 is in contact with the third semiconductor patterns 251 and the fourth semiconductor patterns 252 positioned under the second dummy gate electrode 221 and the second gate spacers 240.

The following description will be made based on FIG. 20B.

Figure 21:
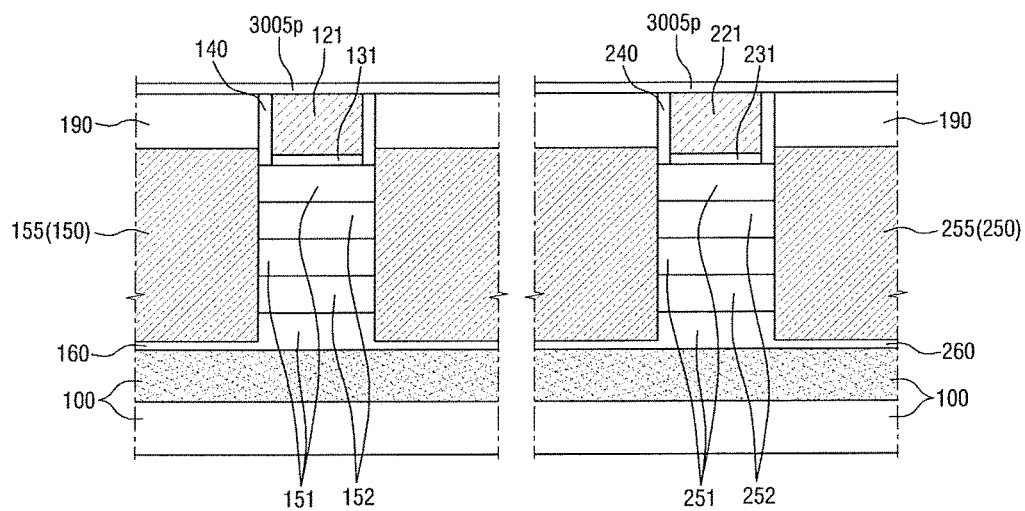

Referring to FIG. 21, an interlayer insulation layer 190 is formed on the substrate 100, the interlayer insulation layer 190 covering the first source/drain 150, the second source/drain 250, the first dummy gate electrode 121, the second dummy gate electrode 221, the first gate spacers 140 and the second gate spacers 240.

The interlayer insulation layer 190 may include at least one of a low k material, oxide, nitride and oxynitride. The low k material may include flowable oxide (FOX), tonen silazene (TOSZ), undoped silica glass (USG), borosilica glass (BSG), phosphosilaca glass (PSG), borophosphosilica glass (BPSG), plasma enhanced tetra ethyl ortho silicate (PRTEOS), fluoride silicate glass (FSG), high density plasma (HDP) oxide, plasma enhanced oxide (PEOX), flowable CVD (FCVD) oxide, or combinations thereof.

Next, the interlayer insulation layer 190 is planarized until the first dummy gate electrode 121 and the second dummy gate electrode 221 are exposed. As the result, the third mask pattern 3003 and the fourth mask pattern 3004 are removed, and a top surface of the first dummy gate electrode 121 and a top surface of the second dummy gate electrode 221 are exposed.

Next, the interlayer insulation layer 190 covering the first region I and the second region II is formed on the mask layer 3005p. Therefore, the top surface of the first dummy gate electrode 121 and the top surface of the second dummy gate electrode 221 are covered by the mask layer 3005p.

The mask layer 3005p may include, for example, at least one of an oxide layer, a nitride layer and an oxynitride layer.

Figure 22:
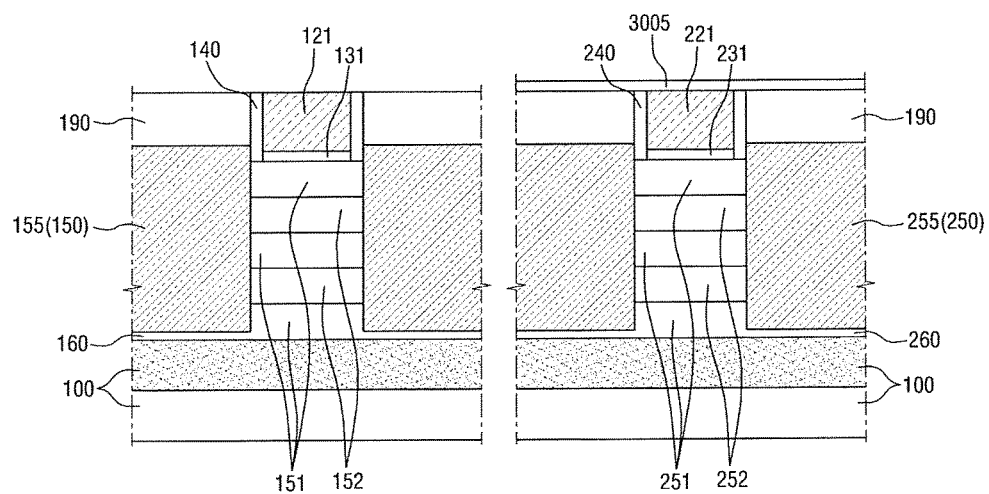

Referring to FIG. 22, the mask layer 3005p formed on the first region I is removed, thereby, forming a fifth mask pattern 3005 on the second region II.

As the mask layer 3005p formed on the first region I is removed, a top surface of the first dummy gate electrode 121 is exposed. In addition, the fifth mask pattern 3005 covers the second dummy gate electrode 221 and the second gate spacers 240.

Figure 23:
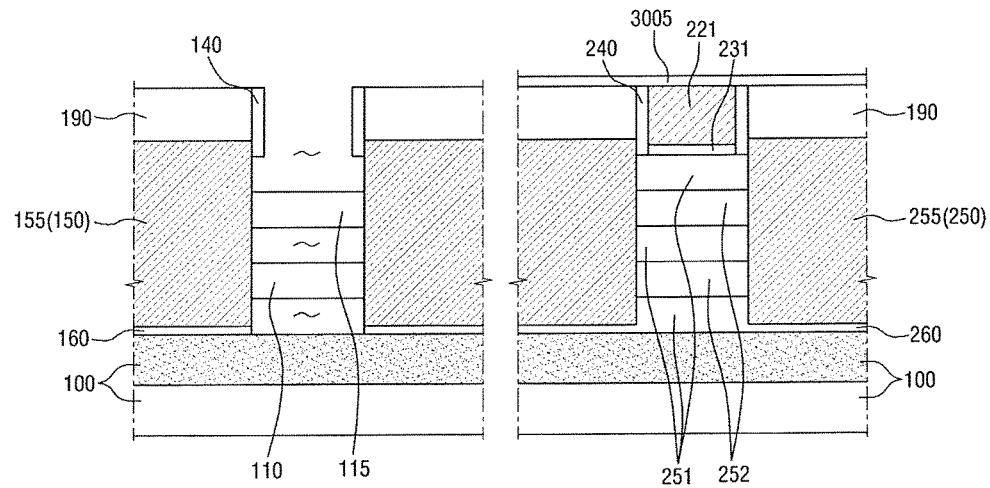

Referring to FIG. 23, the first dummy gate electrode 121 and the first dummy gate insulation layer 131 in the exposed first region I may be sequentially removed using the fifth mask pattern 3005 as a mask.

Next, the first semiconductor patterns 151 are removed using an etchant having a higher etching rate than the second semiconductor patterns 152.

In such a manner, the first wire pattern 110 and the third wire pattern 115 which are made of the second semiconductor patterns 152 are formed on the first region I. For example, first wire pattern groups 110 and 115 including one or more wire patterns are formed on the first region I.

As the first semiconductor patterns 151 are removed, spaces are created. The first epitaxial layer 155 is exposed through the spaces. Hereinafter, such spaces are indicated using mark "~" on the drawings.

Figure 24:
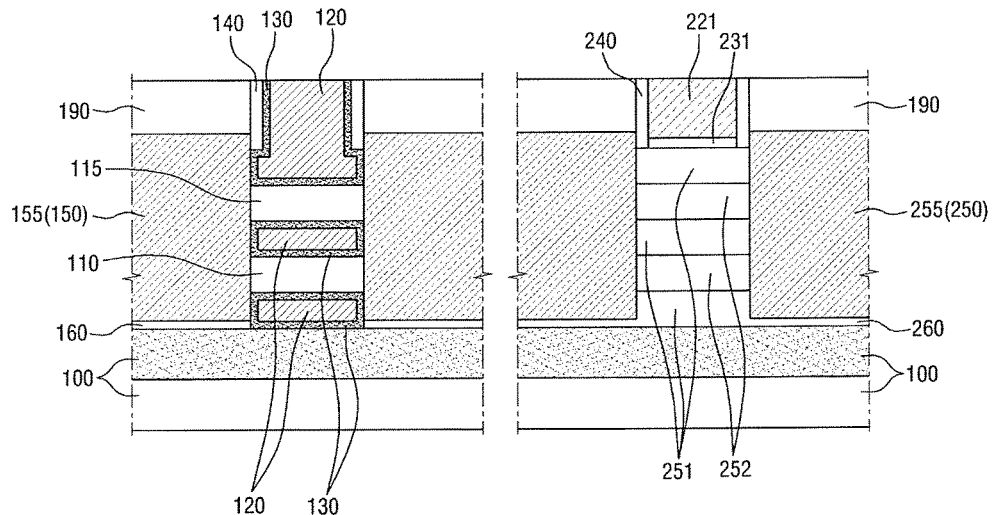

Referring to FIG. 24, the first gate insulation layer 130 is formed along the circumference of the first wire pattern 110, the circumference of the third wire pattern 115, the sidewalls of the first gate spacers 140 and the exposed first epitaxial layer 155.

In such a manner, parts of the first epitaxial layer 155 exposed by removing the first semiconductor patterns 151 are in contact with the first gate insulation layer 130.

Next, a first gate electrode 120 entirely surrounding the circumference of the first wire pattern 110 and the circumference of the third wire pattern 115 is formed on the first gate insulation layer 130.

In order to form the first gate insulation layer 130 and the first gate electrode 120, a planarization process may be performed, and the fifth mask pattern 3005 formed on the second region II is removed through the planarization process.

Figure 25:
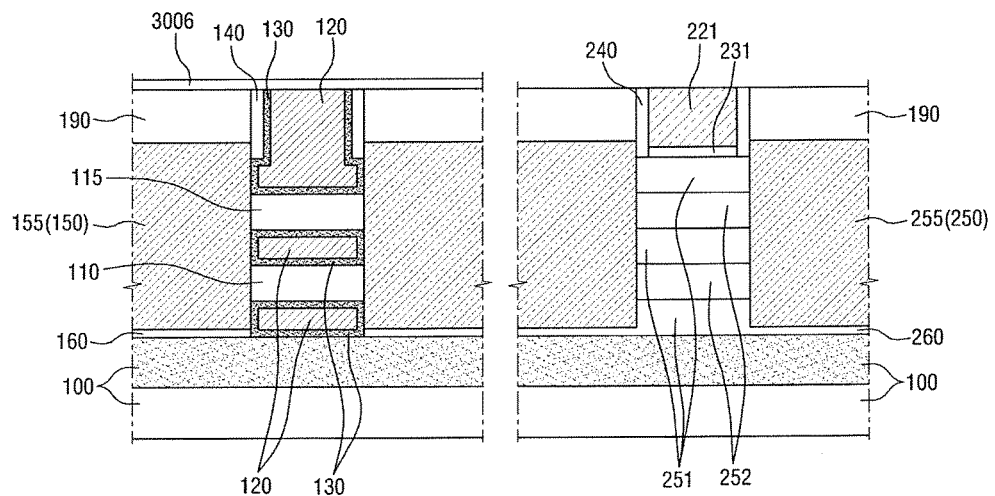

Referring to FIG. 25, a sixth mask pattern 3006 is formed on the first region I, the a sixth mask pattern 3006 covering the first wire pattern groups 110 and 115, the first gate spacers 140 and the first gate electrode 120.

For example, a mask layer covering the first region I and the second region II is formed. Thereafter, the mask layer formed on the second region II is removed, thereby forming a sixth mask pattern 3006 on the first region I. As the sixth mask pattern 3006 is formed on the first region I, a top surface of the second dummy gate electrode 221 is exposed.

The sixth mask pattern 3006 may include, for example, at least one of an oxide layer, a nitride layer and an oxynitride layer.

Figure 26:
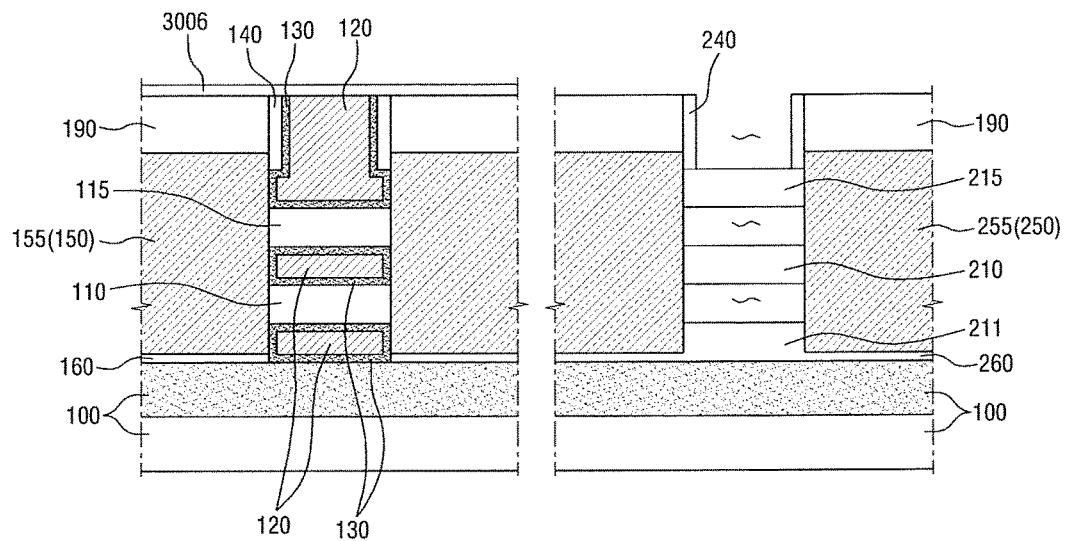

Referring to FIG. 26, the second dummy gate electrode 221 and the second dummy gate insulation layer 231 in the exposed second region II are sequentially removed using the sixth mask pattern 3006 as a mask.

Next, the fourth semiconductor patterns 252 are removed using an etchant having a higher etching rate than the third semiconductor patterns 251.

In such a manner, the second wire pattern 210 and the fourth wire pattern 215 made of the third semiconductor patterns 251 are formed on the substrate 100 of the second region II. For example, second wire pattern groups 210 and 215 including one or more wire patterns are formed on the second region II. Alternatively, when the second wire pattern 210 and the fourth wire pattern 215 may be formed, the third semiconductor patterns 251 being in contact with the substrate 100 need not be formed. In such a manner, a dummy wire pattern 211 being in contact with the substrate 100 need not be formed on the second region II.

As the fourth semiconductor patterns 252 are removed, spaces are created. The second epitaxial layer 255 is exposed through the spaces.

Figure 27:
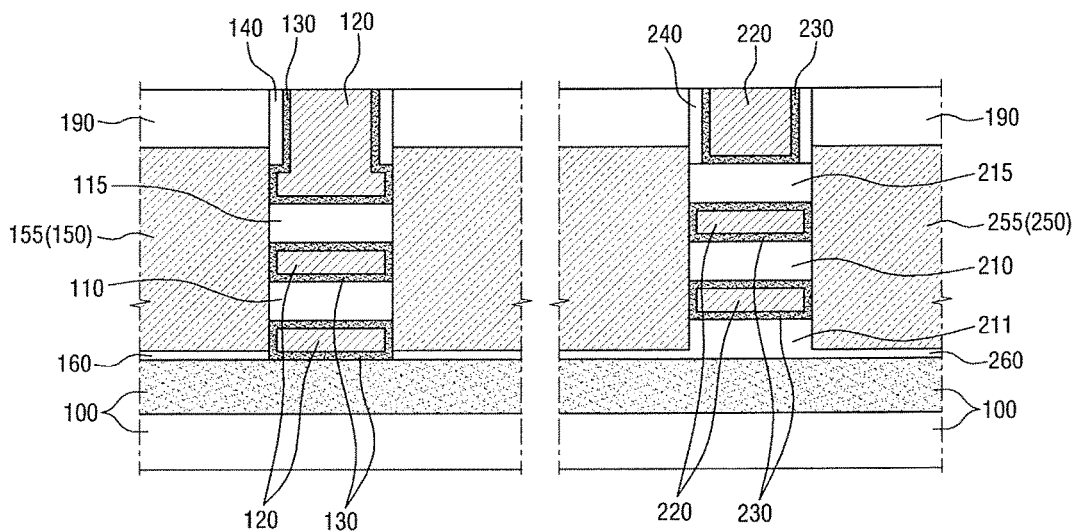

Referring to FIG. 27, the second gate insulation layer 230 is formed along the circumference of the second wire pattern 210, the circumference of the second wire pattern 210, the sidewalls of the second gate spacers 240 and the exposed second epitaxial layer 255. Here, the second gate insulation layer 230 is formed along sidewalls and a top surface of the dummy wire pattern 211.

In such a manner, parts of the second epitaxial layer 255 exposed by removing the fourth semiconductor patterns 252 are in contact with the second gate insulation layer 230.

Next, a second gate electrode 220 is formed on the second gate insulation layer 230, entirely surrounding the circumference of the second wire pattern 210 and the circumference of the fourth wire pattern 215.

To form the second gate insulation layer 230 and the second gate electrode 220, a planarization process is performed, and the sixth mask pattern 3006 formed on the first region I is removed through the planarization process.

Figure 28:
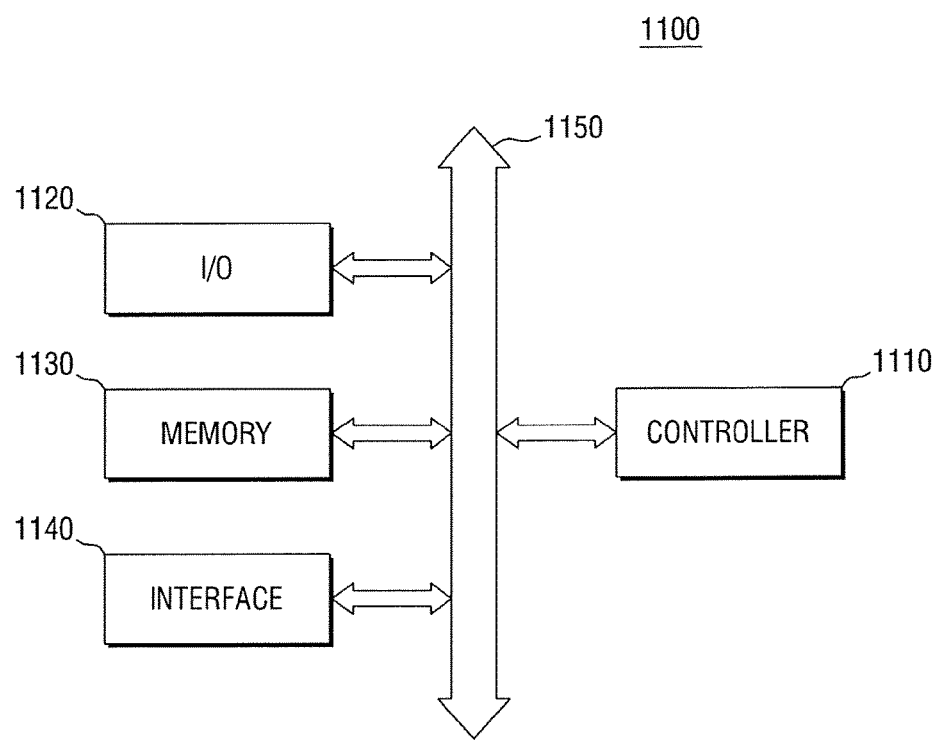
FIG. 28 is a block diagram of an electronic system including a semiconductor device according to an exemplary embodiment of the present inventive concept.

FIG. 28 is a block diagram of an electronic system including a semiconductor device according to an exemplary embodiment of the present inventive concept.

Referring to FIG. 28, the electronic system 1100 includes a controller 1110, an input/output device (I/O) 1120, a memory device 1130, an interface 1140 and a bus 1150. The controller 1110, the I/O 1120, the memory device 1130, and/or the interface 1140 are connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a keypad, a keyboard, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed dynamic random access memory (DRAM) and/or static random access memory (SRAM) as a working memory for the operation of the controller 1110. The memory device 1130, the controller 1110 or the I/O 1120 may include a semiconductor device according to an exemplary embodiment of the present embodiment.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 29:
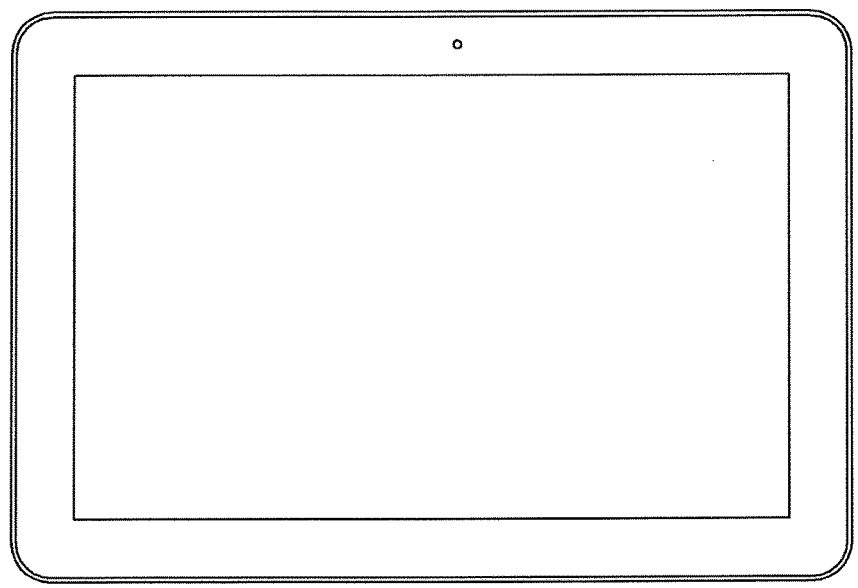
FIGS. 29 and 30 illustrate exemplary semiconductor systems including a semiconductor device according to an exemplary embodiment of the present inventive concept.
Figure 30:
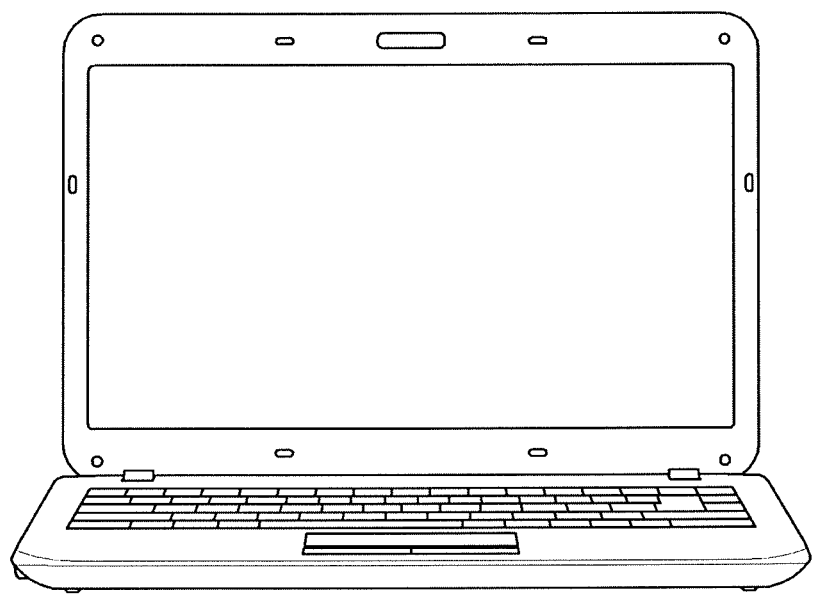

FIGS. 29 and 30 illustrate exemplary semiconductor systems according to an exemplary embodiment of the present inventive concept. FIG. 29 illustrates a tablet PC including a semiconductor device according to an exemplary embodiment of the present inventive concept, and FIG. 30 illustrates a notebook computer including a semiconductor device according to an exemplary embodiment of the present inventive concept. At least one of the semiconductor devices according to exemplary embodiments of the present inventive concept may be employed to a tablet PC, a notebook computer, and the like.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

What is claimed is:

1. A semiconductor device comprising:
   a substrate including a first region and a second region;
   a first wire pattern, extending in a first direction, formed at a first height from the substrate of the first region;
   a second wire pattern, extending in a second direction, formed at a second height from the substrate of the second region, wherein the first height is different from the second height;
   a first gate electrode extending in a third direction crossing the first direction and surrounding the first wire pattern;
   a second gate electrode extending in a fourth direction crossing the second direction and surrounding the second wire pattern;
   a first gate insulation layer formed along a circumference of the first wire pattern and a sidewall of the first gate electrode; and
   a second gate insulation layer formed along a circumference of the second wire pattern and a sidewall of the second gate electrode.

2. The semiconductor device of claim 1, further comprising
   a first source/drain which is in contact with the first wire pattern and a second source/drain which is in contact with the second wire pattern,
   wherein the first source/drain includes a first epitaxial layer and the second source/drain includes a second epitaxial layer.

3. The semiconductor device of claim 2,
   wherein the first epitaxial layer is in contact with the first wire pattern and the first gate insulation layer, and
   wherein the second epitaxial layer is in contact with the second wire pattern and the second gate insulation layer.

4. The semiconductor device of claim 2,
   wherein each of the first epitaxial layer and the second epitaxial layer is shaped of at least one of a diamond, a circle and a rectangle.

5. The semiconductor device of claim 1, further comprising
   a first gate spacer disposed on the sidewall of the first gate electrode and a second gate spacer disposed on the sidewall of the second gate electrode,
   wherein the first gate insulation layer is further formed along the sidewall of the first gate spacer and the second gate insulation layer is further formed along the sidewall of the second gate spacer.

6. The semiconductor device of claim 1, further comprising:
a first source/drain disposed on the first wire pattern and a second source/drain disposed on the second wire pattern,
wherein the first source/drain includes a first semiconductor pattern and a second semiconductor pattern stacked one on the other, and
wherein the second source/drain includes a third semiconductor pattern and a fourth semiconductor pattern stacked one on the other.

7. The semiconductor device of claim 6,
wherein the second semiconductor pattern is in contact with the first wire pattern, and
wherein the third semiconductor pattern is in contact with the second wire pattern.

8. The semiconductor device of claim 1, further comprising a third wire pattern, extending in the first direction, formed at a third height from the substrate of the first region,
wherein the second height is greater than the first height, and the third height is greater than the second height.

9. The semiconductor device of claim 8,
wherein the first height is measured from a top surface of the substrate to a topmost part of the first wire pattern,
wherein the second height is measured from the top surface of the substrate to a topmost part of the second wire pattern,
wherein the third height is measured from the top surface of the substrate to a topmost part of the third wire pattern,
wherein a bottommost part of the third wire pattern is positioned at the second height and
wherein the second wire pattern is positioned between the first height and the second height.

10. The semiconductor device of claim 9,
wherein a bottommost part of the second wire pattern is positioned at the first height.

11. The semiconductor device of claim 8, further comprising a fourth wire pattern, extending in the second direction, formed at a fourth height from the substrate of the second region,
wherein the fourth height is greater than the third height.

12. The semiconductor device of claim 11,
wherein the first wire pattern and the third wire pattern include a same material,
wherein the second wire pattern and the fourth wire pattern include a same material, and
wherein the first wire pattern and the second wire pattern include different materials.

13. The semiconductor device of claim 1,
wherein the first wire pattern and the second wire pattern include different materials.

14. The semiconductor device of claim 13,
wherein the first region is a PFET forming region and the second region is an NFET forming region, the first wire pattern includes at least one of SiGe and Ge, and the second wire pattern includes at least one of Si and a III-V group compound semiconductor material.

15. The semiconductor device of claim 1, further comprising
a dummy wire pattern interposed between the substrate of the second region and the second wire pattern and extended in the second direction,
wherein the dummy wire pattern is in contact with the substrate.

16. The semiconductor device of claim 1,
wherein the substrate includes an insulation layer,
wherein the first wire pattern and the second wire pattern are formed on the insulation layer.

17. The semiconductor device of claim 11, further comprising:
a first source/drain including a first epitaxial layer and a second source/drain including a second epitaxial layer,
wherein the first source/drain is in contact with the first wire pattern and the third wire pattern, and
wherein the second source/drain is in contact with the second wire pattern and the fourth wire pattern.

18. The semiconductor device of claim 17, wherein a portion of the first gate insulation layer is in contact with the first epitaxial layer of the first source/drain and a portion of the second gate insulation layer is in contact with the second epitaxial layer of the second source/drain.

19. The semiconductor device of claim 17, further comprising a first seed layer and a second seed layer, wherein the first seed layer is interposed between the first epitaxial layer and the substrate of the first region, and wherein the second seed layer is interposed between the second epitaxial layer and the substrate of the second region.

20. The semiconductor device of claim 19, wherein the first seed layer and the second seed layer include a same material.

21. A semiconductor device comprising:
a substrate including a first region and a second region;
a first wire pattern and a third wire pattern formed on the substrate of the first region;
a second wire pattern and a fourth wire pattern formed on the substrate of the second region;
a first gate electrode including a first portion and a second portion, wherein the first portion surrounds the first wire pattern and the third wire pattern;
a second gate electrode including a third portion and a fourth portion, wherein the third portion surrounds the second wire pattern and the fourth wire pattern;
a first gate spacer formed on the second portion of the first gate electrode;
a second gate spacer formed on the fourth portion of the second gate electrode;
a first source/drain being in contact with the first wire pattern and the third wire pattern;
a second source/drain being in contact with the second wire pattern and the fourth wire pattern;
a first gate insulation layer formed along a circumference of the first wire pattern, a circumference of the third wire pattern and a sidewall of the second portion of the first gate electrode, wherein the first gate insulation layer is in contact with the first source/drain and a sidewall of the first gate spacer; and
a second gate insulation layer formed along a circumference of the second wire pattern, a circumference of the fourth wire pattern and a sidewall of the fourth portion of the second gate electrode, wherein the second gate insulation layer is in contact with the second source/drain and a sidewall of the second gate spacer,
wherein the first to fourth wire patterns are disposed at different heights from a top surface of the substrate.

22. The semiconductor device of claim 21, further comprising a dummy wire pattern formed between the substrate and the second wire pattern in the second region, wherein the dummy wire pattern is in contact with the substrate.

23. The semiconductor device of claim 22, wherein the first wire pattern is not in contact with the substrate.

* * * * *